(12) United States Patent
Lin et al.

(10) Patent No.: US 10,868,139 B2
(45) Date of Patent: Dec. 15, 2020

(54) CONTROLLING PROFILES OF REPLACEMENT GATES

(71) Applicant: Taiwan Semiconductor Manufacturing Company, Ltd., Hsinchu (TW)

(72) Inventors: Chih-Han Lin, Hsinchu (TW); Kuei-Yu Kao, Hsinchu (TW); Ming-Ching Chang, Hsinchu (TW); Chan-Lon Yang, Taipei (TW); Chao-Cheng Chen, Hsinchu (TW); Syun-Ming Jang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/569,859

(22) Filed: Sep. 13, 2019

(65) Prior Publication Data

US 2020/0006527 A1    Jan. 2, 2020

Related U.S. Application Data

(62) Division of application No. 16/009,793, filed on Jun. 15, 2018, now Pat. No. 10,658,491.

(51) Int. Cl.
*H01L 29/76* (2006.01)
*H01L 29/66* (2006.01)
(Continued)

(52) U.S. Cl.
CPC .. *H01L 29/66545* (2013.01); *H01L 21/31111* (2013.01); *H01L 21/762* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 2013/0270624 A1 | 10/2013 | Yun et al. |
| 2014/0070285 A1 | 3/2014 | Xie et al. |

(Continued)

FOREIGN PATENT DOCUMENTS

| KR | 19980067517 A | 10/1998 |
| KR | 20000007795 A | 2/2000 |

(Continued)

*Primary Examiner* — Hung K Vu
(74) *Attorney, Agent, or Firm* — Slater Matsil, LLP

(57) ABSTRACT

A method includes forming a dummy gate electrode layer over a semiconductor region, forming a mask strip over the dummy gate electrode layer, and performing a first etching process using the mask strip as a first etching mask to pattern an upper portion of the dummy gate electrode layer. A remaining portion of the upper portion of the dummy gate electrode layer forms an upper part of a dummy gate electrode. The method further includes forming a protection layer on sidewalls of the upper part of the dummy gate electrode, and performing a second etching process on a lower portion of the dummy gate electrode layer to form a lower part of the dummy gate electrode, with the protection layer and the mask strip in combination used as a second etching mask. The dummy gate electrode and an underlying dummy gate dielectric are replaced with a replacement gate stack.

18 Claims, 27 Drawing Sheets

(51) Int. Cl.
*H01L 29/78* (2006.01)
*H01L 21/311* (2006.01)
*H01L 21/762* (2006.01)

(56) References Cited

U.S. PATENT DOCUMENTS

2016/0111531 A1    4/2016   Dong
2017/0005005 A1*   1/2017   Chen .................. H01L 27/0886
2017/0338326 A1   11/2017   Ching et al.

FOREIGN PATENT DOCUMENTS

KR     20130117130 A    10/2013
KR     20170112939 A    10/2017

* cited by examiner

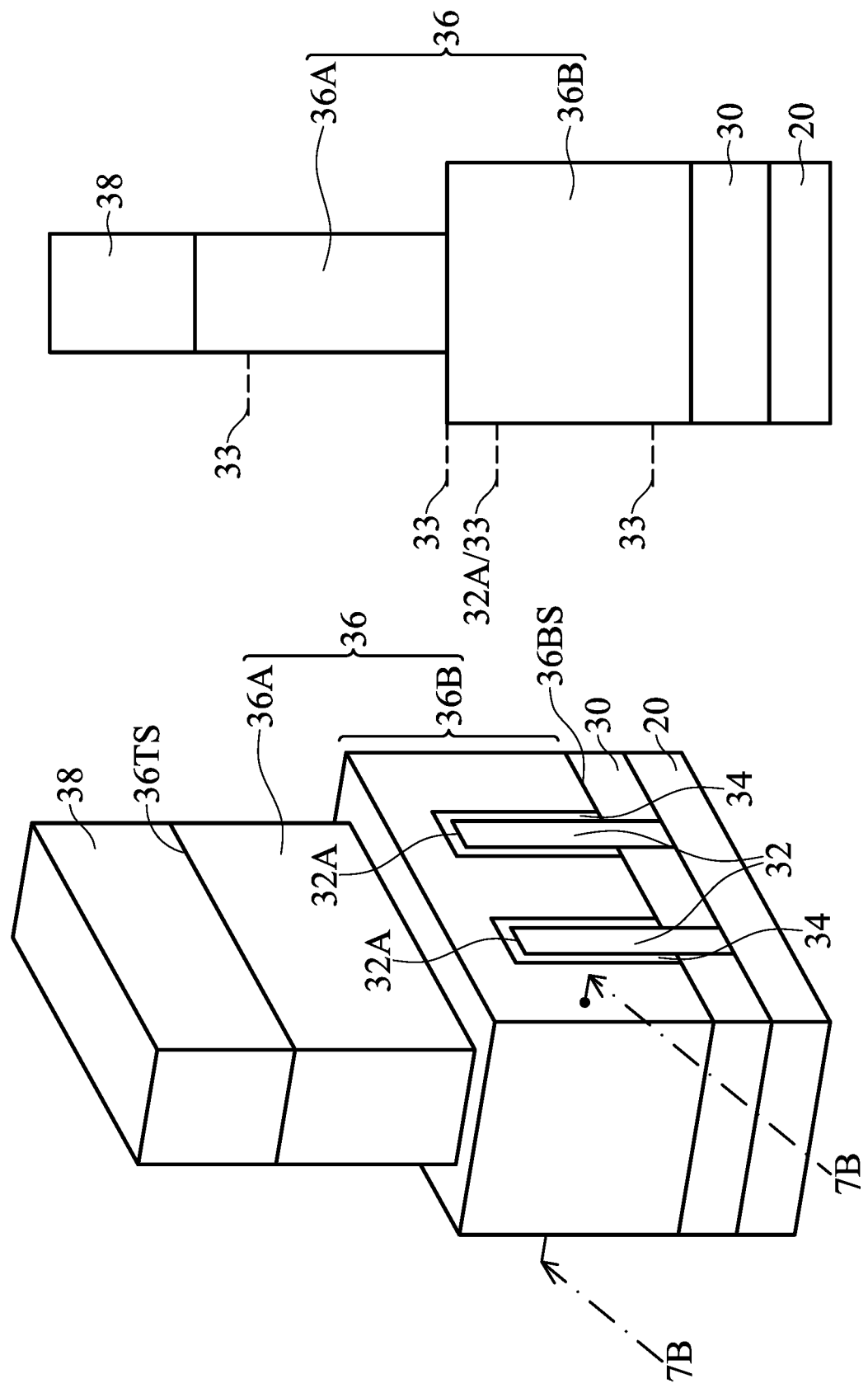

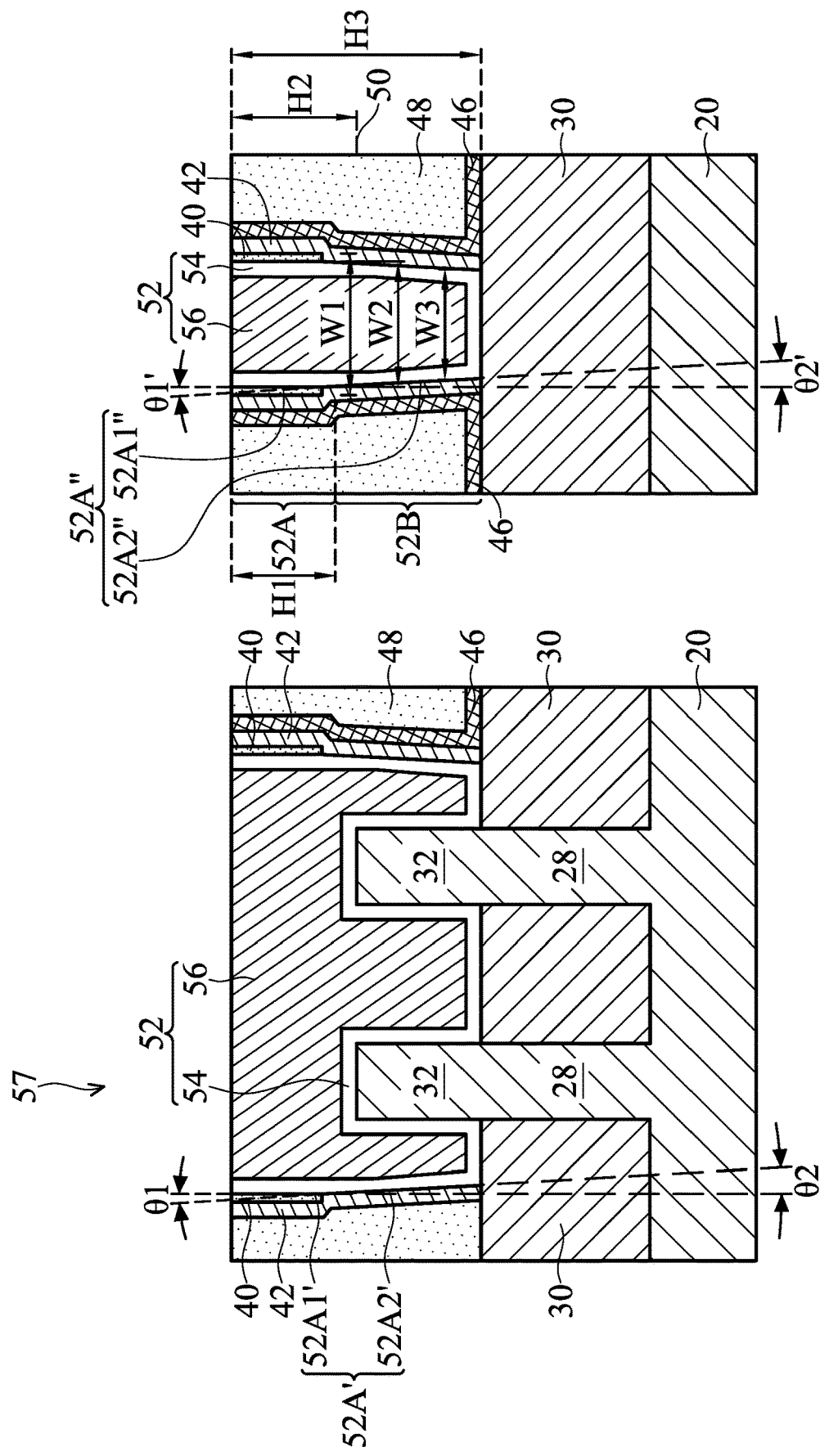

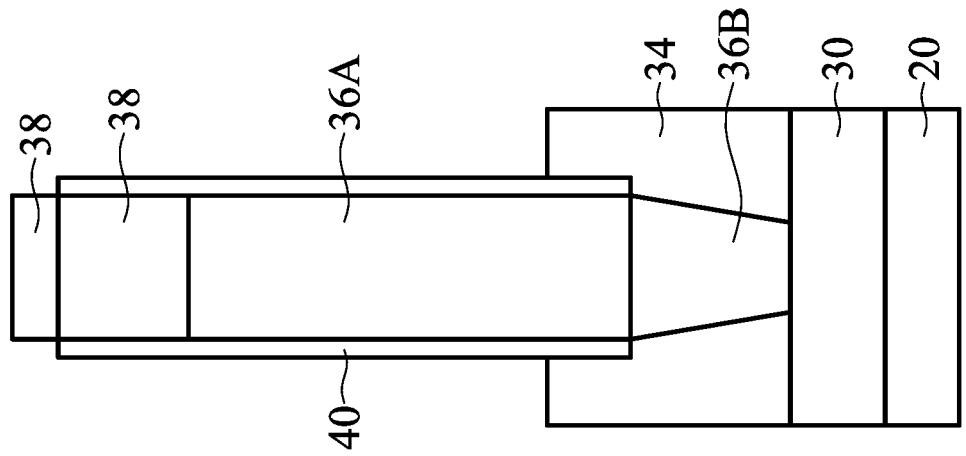
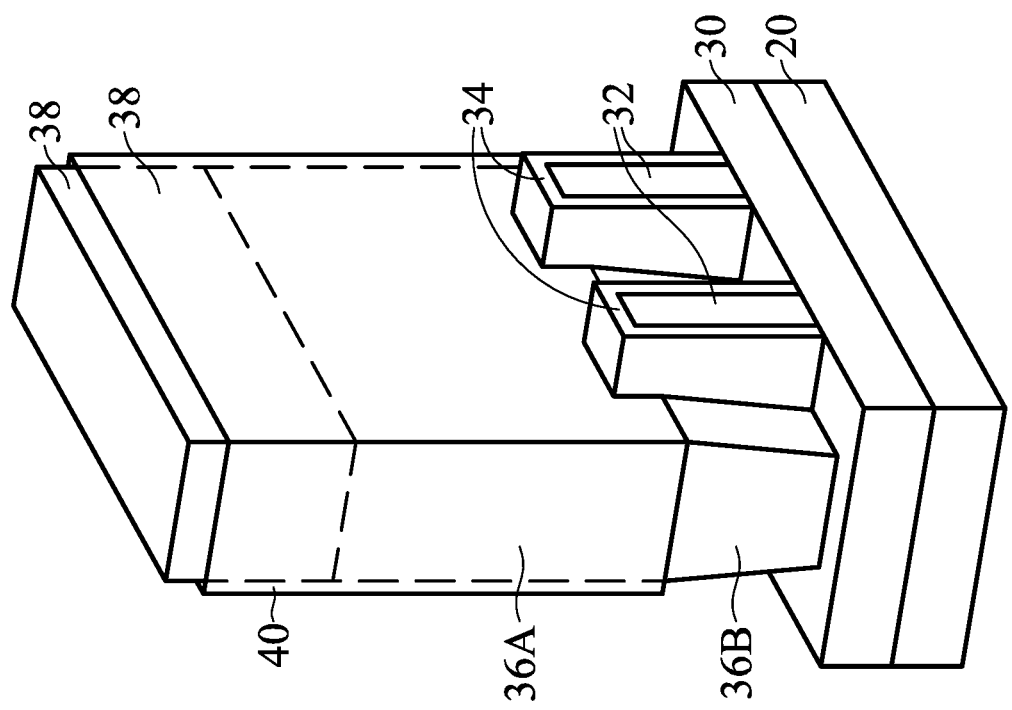
FIG. 19B
FIG. 19A

US 10,868,139 B2

CONTROLLING PROFILES OF REPLACEMENT GATES

PRIORITY CLAIM AND CROSS-REFERENCE

This application is a divisional of U.S. patent application Ser. No. 16/009,793, entitled "Controlling Profiles of Replacement Gates," filed on Jun. 15, 2018, which application is incorporated herein by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating the FinFETs are being developed.

The formation of FinFETs typically includes forming dummy gate stacks, and replacing the dummy gate stacks with replacement gate stacks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 6A, 6B, 7A, 7B, 8A, 8B, 9A, 9B, 10A, 10B, 11A, 11B, 11C, 12A, 12B, and 12C are perspective views and/or cross-sectional views of intermediate stages in the formation of a Fin Field-Effect Transistor (FinFET) in accordance with some embodiments.

FIGS. 15A, 15B, 16A, 16B, 17A, 17B, 18A, 18B, 19A, 19B, 20A, 20B, 20C, 21A, 21B, and 21C are perspective views and cross-sectional views of intermediate stages in the formation of a FinFET in accordance with some embodiments.

DETAILED DESCRIPTION

Figure 1:
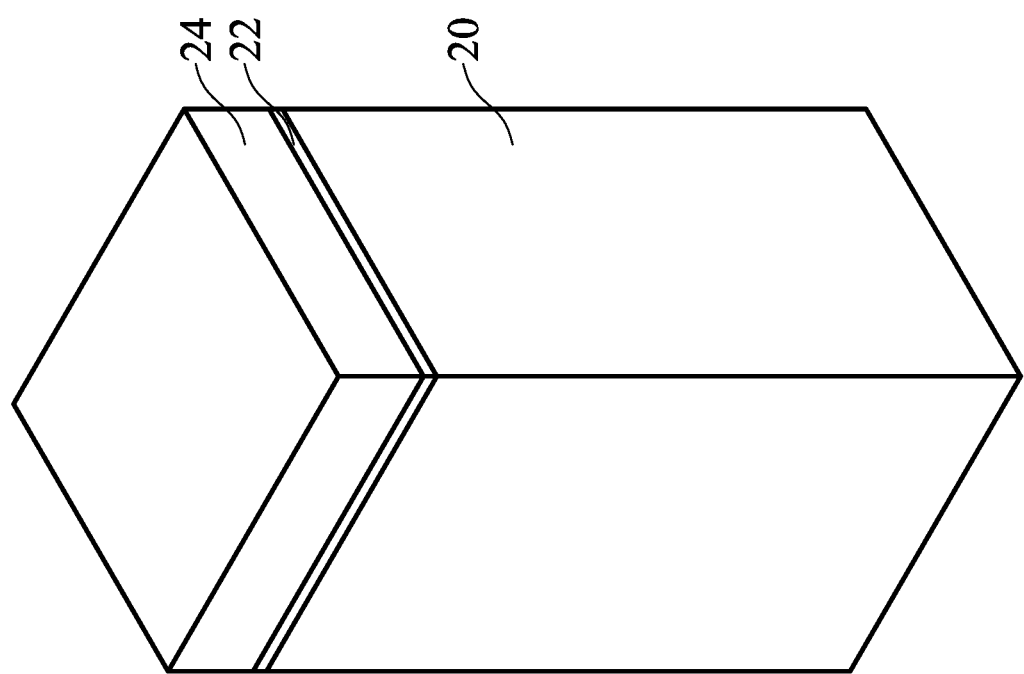

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and the methods of forming the same are provided in accordance with some embodiments of the present disclosure. The intermediate stages of forming the FinFETs are illustrated. Some variations of some embodiments are discussed. Throughout the various views and embodiments, like reference numbers are used to designate like elements.

Figure 23:
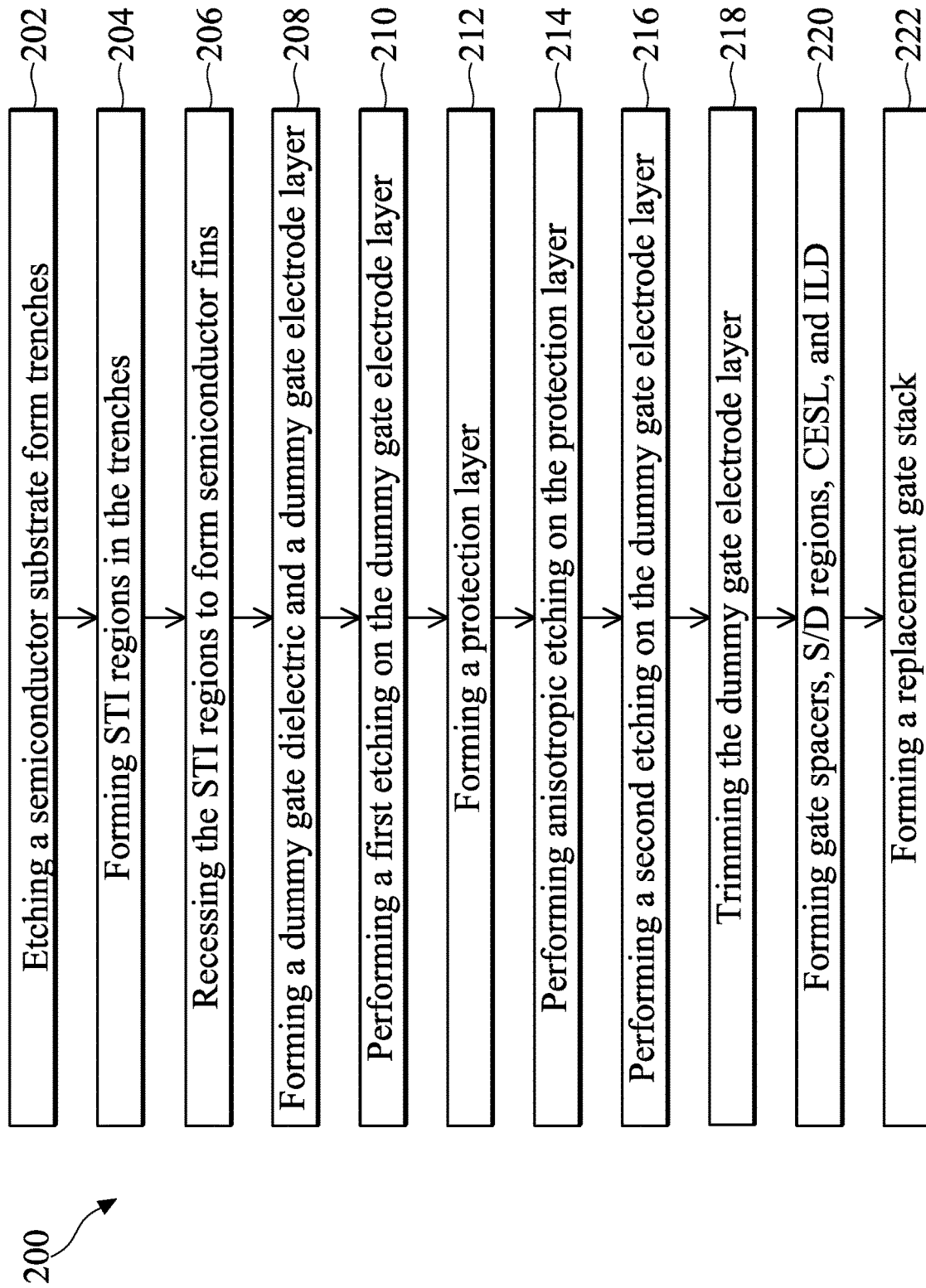
FIG. 23 illustrates a process flow for forming a FinFET in accordance with some embodiments.

FIGS. 1 through 12A, 12B, and 12C illustrate the perspective views and/or cross-sectional views of intermediate stages in the formation of a FinFET in accordance with some embodiments. The steps shown in FIGS. 1 through 12A, 12B, and 12C are also illustrated schematically in the process flow 200 shown in FIG. 23.

FIG. 1 illustrates a perspective view of substrate 20, which may be a part of a wafer. Substrate 20 may be a semiconductor substrate, such as a silicon substrate, a silicon carbon substrate, a III-V compound semiconductor substrate, or a substrate formed of other semiconductor materials. Substrate 20 may be a bulk semiconductor substrate or a silicon-on-insulator substrate. Substrate 20 may be lightly doped with a p-type or an n-type impurity.

Pad oxide 22 and hard mask 24 are formed over semiconductor substrate 20. In accordance with some embodiments of the present disclosure, pad oxide 22 is formed of silicon oxide, which may be formed by oxidizing a surface layer of semiconductor substrate 20. Hard mask 24 may be formed of silicon nitride, silicon oxynitride, silicon carbonitride, or the like.

Figure 2:
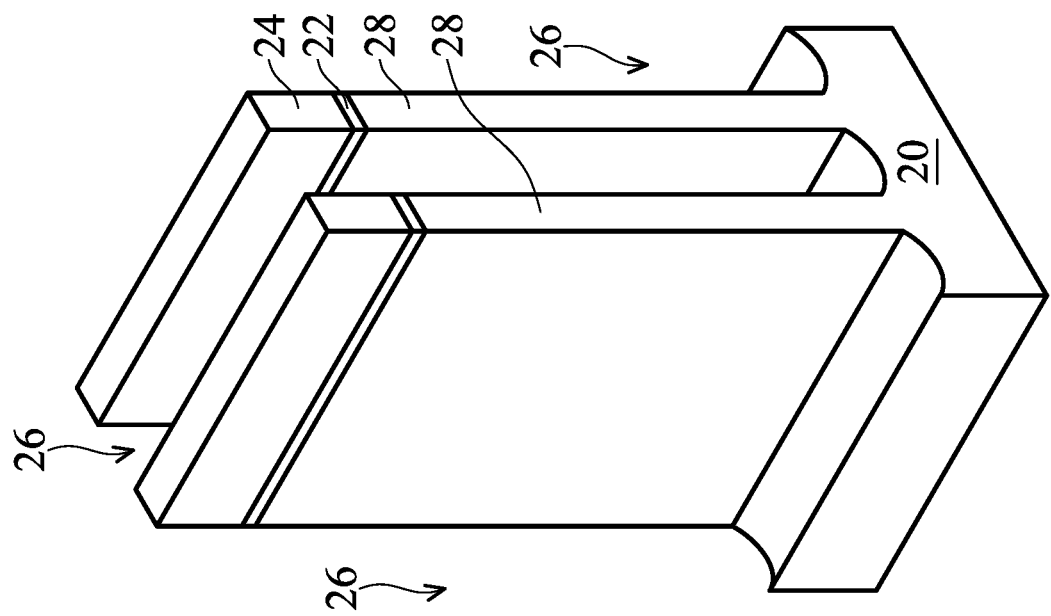

Next, as shown in FIG. 2, hard mask 24 and pad oxide 22 are patterned to form parallel strips. The parallel strips are then used as an etching mask to etch substrate 20, forming trenches 26 extending into semiconductor substrate 20. The respective process is illustrated as process 202 in the process flow shown in FIG. 23. Accordingly, semiconductor strips 28 are formed. Trenches 26 extend into semiconductor substrate 20, and have lengthwise directions parallel to each other.

Figure 3:
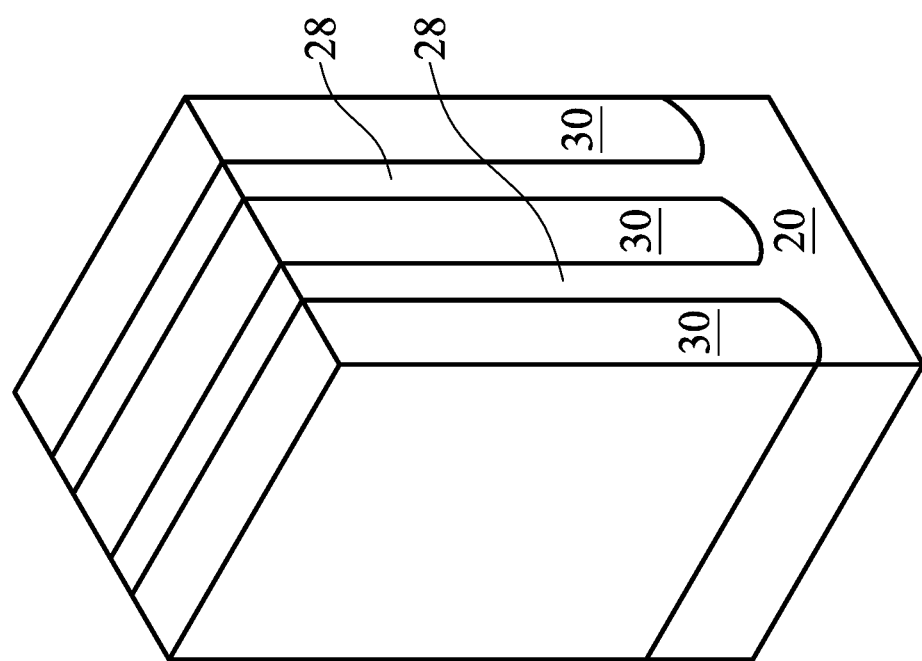

Next, trenches 26 are filled to form isolation regions 30, as shown in FIG. 3. Isolation regions 30 are alternatively referred to as Shallow Trench Isolation (STI) regions 30. The respective process is illustrated as process 204 in the process flow shown in FIG. 23. The formation may include filling trenches 26 with a dielectric layer(s), for example, using Flowable Chemical Vapor Deposition (FCVD), and performing a Chemical Mechanical Polish (CMP) to level the top surface of the dielectric material with the top surface of hard mask 24. After the CMP, hard mask 24 and pad oxide 22 (FIG. 2) are removed.

Figure 4:
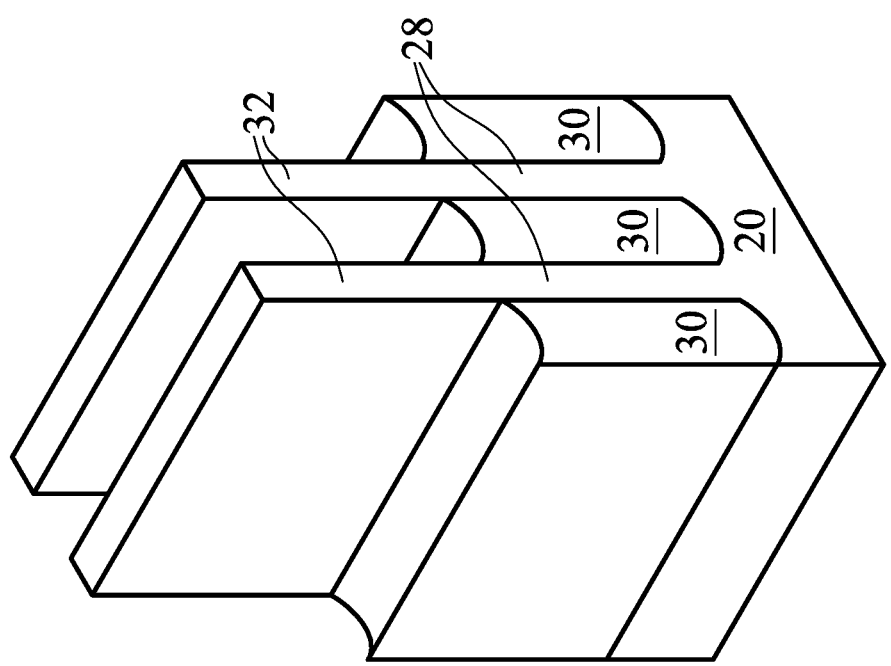

Next, referring to FIG. 4, STI regions 30 are recessed, so that the top surfaces of the resulting STI regions 30 are lower than the top surface of semiconductor strips 28. The respective process is illustrated as process 206 in the process flow shown in FIG. 23. Throughout the description, the upper portions of semiconductor strips 28, which upper portions are higher than the top surfaces of STI regions 30, are referred to as semiconductor fins 32, while the lower portions of semiconductor strips 28 lower than the top surfaces of STI regions 30 remain to be referred to as semiconductor strips 28.

In above-illustrated examples of embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 5:
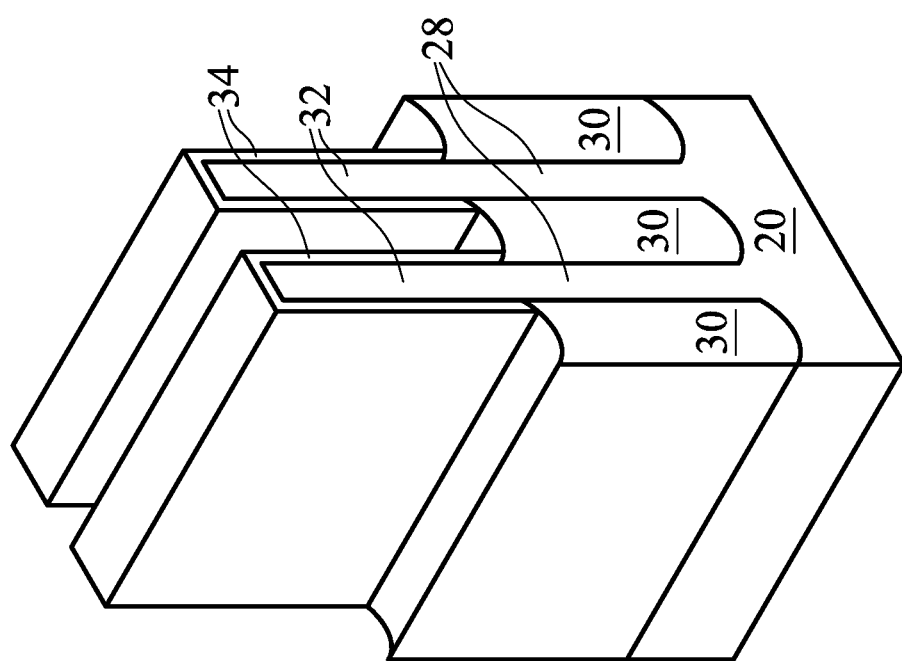

FIG. 5 illustrates the formation of dummy gate dielectrics 34. The respective process is illustrated as process 208 in the process flow shown in FIG. 23. In accordance with some embodiments of the present disclosure, dummy gate dielectrics 34 are formed of an oxide such as silicon oxide, and hence are alternatively referred to as dummy oxides 34. Dummy oxides 34 may be formed through deposition or oxidizing the surface layers of semiconductor fins 32. Accordingly, dummy oxides 34 may or may not extend on the top surfaces of STI regions 30.

Figure 6B:
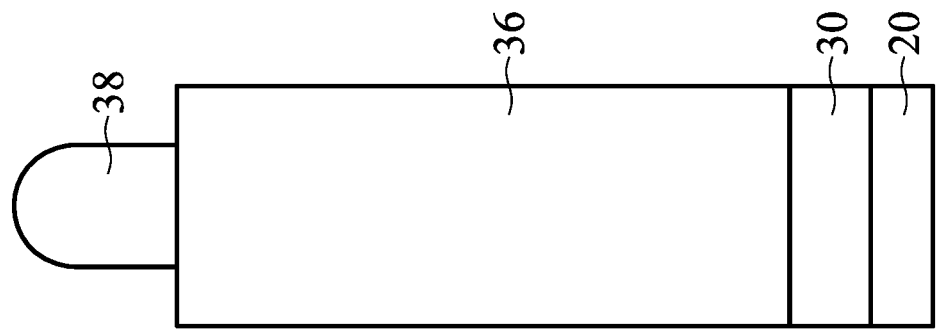
Figure 6A:
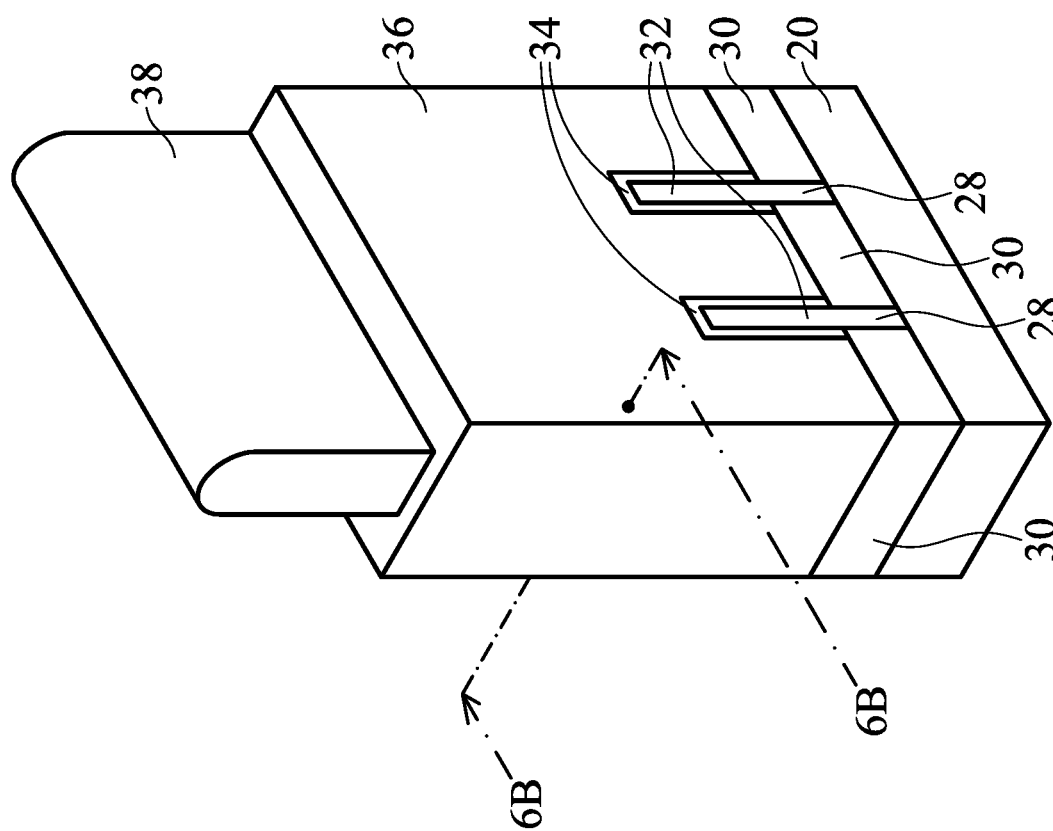

FIGS. 6A and 6B illustrates the formation of dummy gate electrode layer 36 and hard mask 38 over dummy gate electrode layer 36. The respective process is also illustrated as process 208 in the process flow shown in FIG. 23. FIG. 6B illustrates a cross-sectional view of the structure shown in FIG. 6A, wherein the cross-sectional view is obtained from a vertical plane containing line 6B-6B in FIG. 6A. The entire dummy gate electrode layer 36 may be formed of a homogeneous material including same elements with same percentages. In accordance with some embodiments of the present disclosure, dummy gate electrode layer 36 is formed of amorphous silicon or polysilicon. In accordance with other embodiments of the present disclosure, dummy gate electrode layer 36 is formed of amorphous carbon, an oxide such as silicon oxide, a nitride such as silicon nitride, or the like. The formation method may be Atomic Layer Deposition (ALD), Chemical Vapor Deposition (CVD), Plasma Enhance Chemical Vapor Deposition (PECVD), spin-coating, or the like. A planarization process such as a Chemical Mechanical Polish (CMP) process or a mechanical grinding process is then preformed to level the top surface of dummy gate electrode layer 36.

Hard mask 38 is formed over dummy gate electrode layer 36, and is then patterned as a hard mask strip, which crosses over semiconductor fins 32. It is appreciated that although one hard mask strip 38 is illustrated, there may be a plurality of hard mask strips 38 parallel to each other, with the plurality of hard mask strips 38 over and across the underlying semiconductor fins 32. Hard mask 38 may be formed of silicon nitride, silicon oxynitride, or the like, and may be a single layer or a composite layer including a plurality of layers.

Figure 16B:
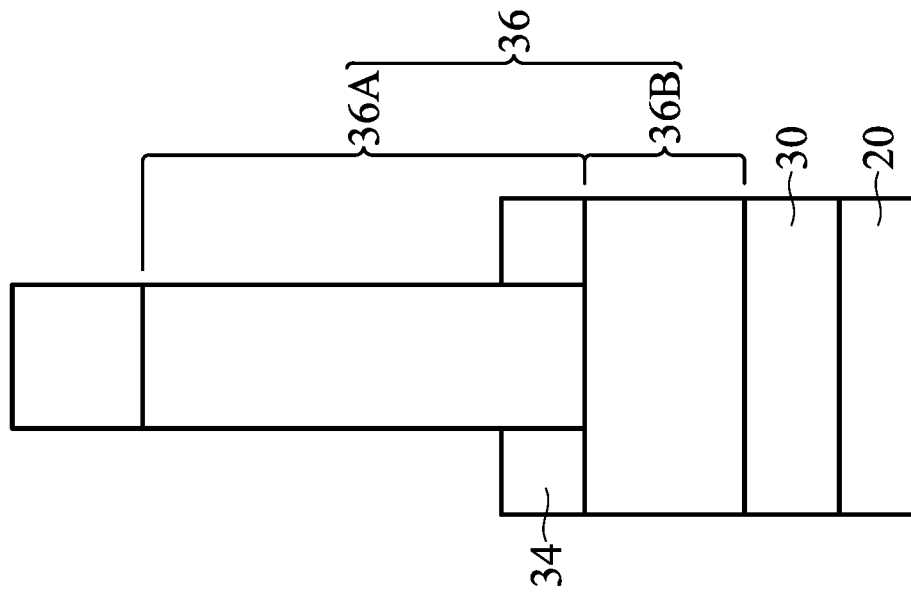
Figure 16A:
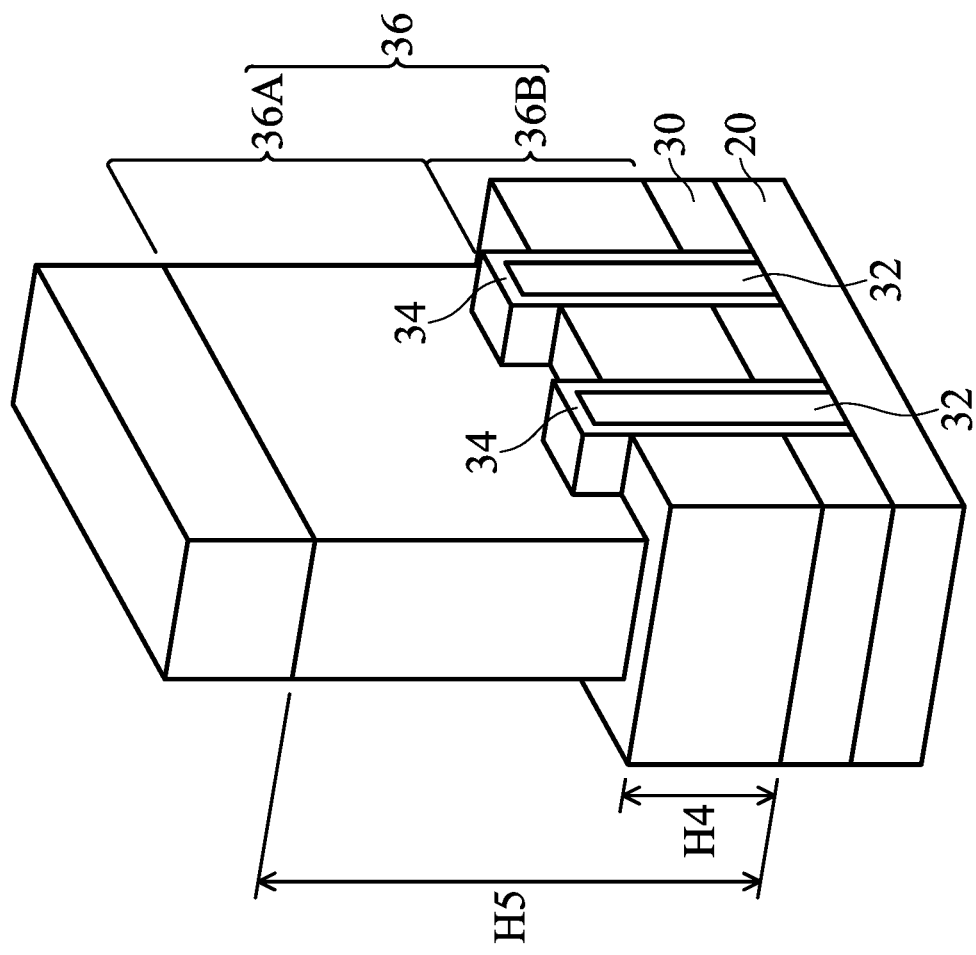
Figure 17B:
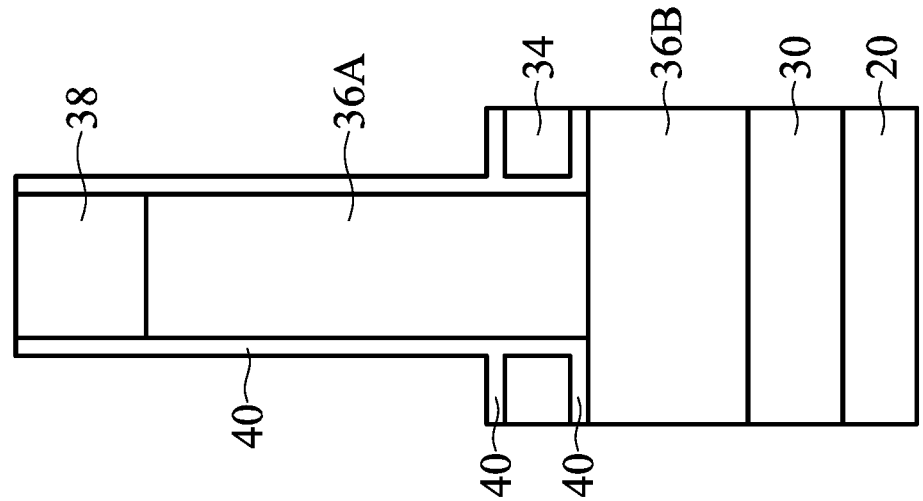
Figure 17A:
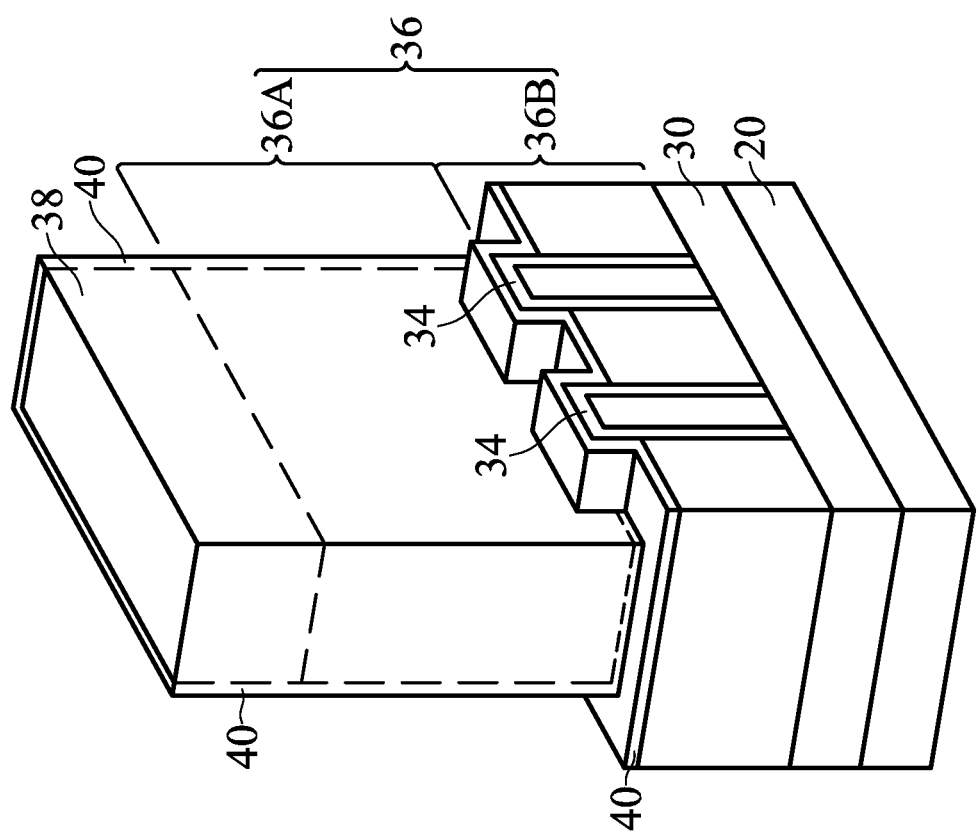

Next, as shown in FIGS. 7A and 7B, a first etching process is performed to etch dummy gate electrode layer 36. The respective process is illustrated as process 210 in the process flow shown in FIG. 23. The etching is stopped at an intermediate level between top surface 36TS and bottom surface 36BS, which are the top surface and bottom surface, respectively, of dummy gate electrode layer 36. In accordance with some embodiments of the present disclosure, the etching is stopped at a level higher than the top surfaces 32A of semiconductor fins 32, as illustrated in FIGS. 7A and 7B. A lower portion 36B of dummy gate electrode layer 36 remains un-etched. In accordance with other embodiments of the present disclosure, the etching is stopped at a level lower than (as illustrated in FIGS. 16A and 16B) or level with the top surfaces 32A of semiconductor fins 32. The etching is performed using hard mask 38 as an etching mask.

The etching process shown in FIGS. 7A and 7B is performed using an anisotropic etching method, and is performed using dry etching in accordance with some embodiments. The resulting upper dummy gate electrode portion 36A has substantially vertical sidewalls. In accordance with some embodiments in which dummy gate electrode layer 36 is formed of amorphous silicon or polysilicon, the etching gas may include a mixture of HBr, chlorine ($Cl_2$), and a fluorine-based gas. The fluorine-base gas may include $C_2F_6$, $CF_4$, $F_2$, or the like. A carrier gases such as nitrogen ($N_2$) or argon may also be added into the etching gas. Plasma is turned on, with a first bias power being applied. The first bias power may be in the range between about 200 Watts and about 400 Watts, for example.

FIG. 7B illustrates a cross-sectional view of the structure shown in FIG. 7A, wherein the cross-sectional view is obtained from the plane containing line 7B-7B in FIG. 7A. The top surface level 32A of semiconductor fins 32 is illustrated. Dashed lines 33 are also illustrated to schematically illustrate the possible levels where the first etching process may be stopped.

Figure 8B:
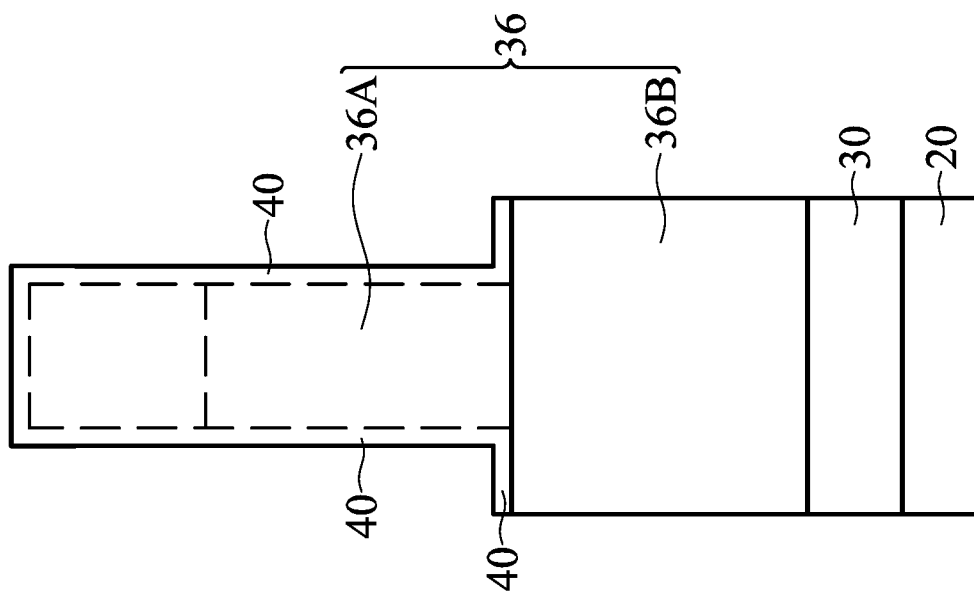
Figure 8A:
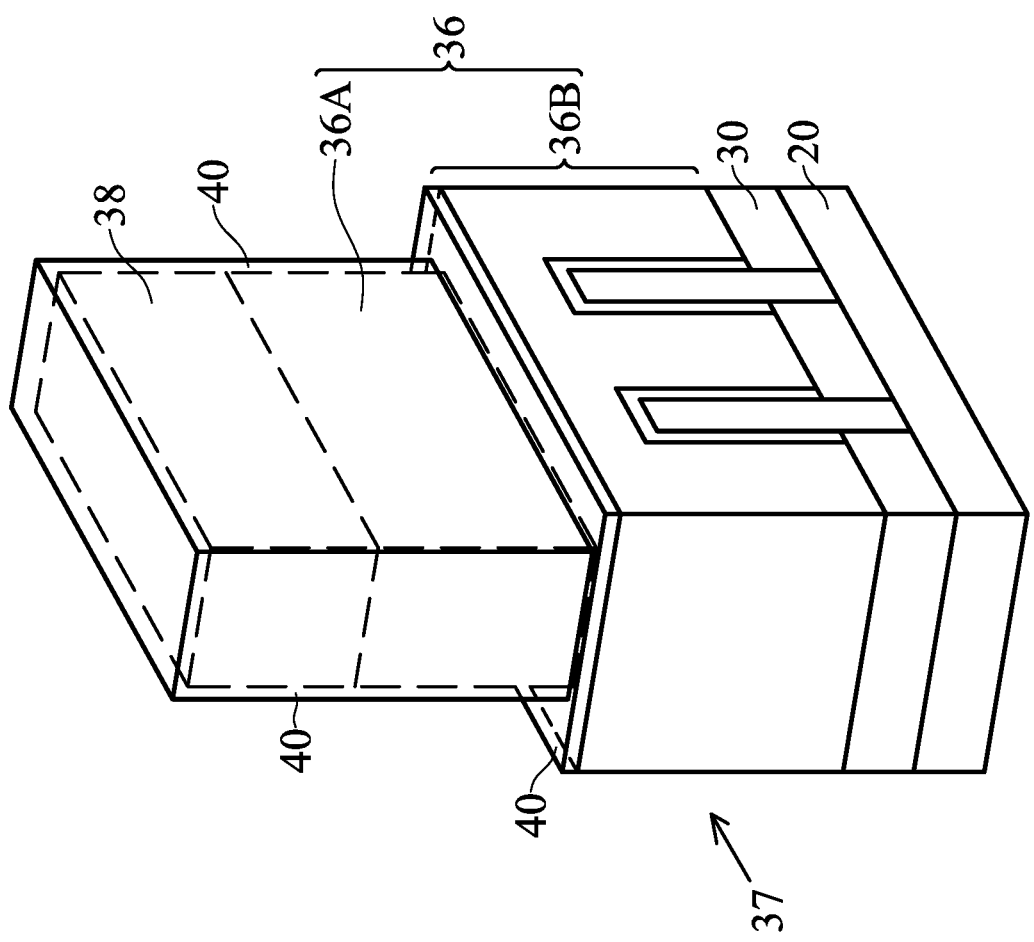

Referring to FIGS. 8A and 8B, protection layer 40 is formed. The respective process is illustrated as process 212 in the process flow shown in FIG. 23. The material of protection layer 40 is different from the material of dummy gate electrode layer 36, dummy gate dielectrics 34, and STI regions 30. In accordance with some embodiments of the present disclosure, protection layer 40 is formed of SiN, SiON, SiCON, SiC, SiOC, $SiO_2$, or the like. The thickness of protection layer 40 may be in the range between about 2 Å and about 10 Å. Protection layer 40 is formed using a conformal deposition method such as ALD or CVD. Accordingly, protection layer 40 includes sidewall portions on the sidewalls of hard mask 38 and upper dummy gate electrode portion 36A. Protection layer 40 further includes horizontal portions on the top surface of hard mask 38 and the top surface of lower dummy gate electrode portion 36B.

FIG. 8B illustrates a perspective view of the structure shown in FIG. 8A, wherein the perspective view is obtained from the direction marked by arrow 37 shown in FIG. 8A.

Figure 9B:
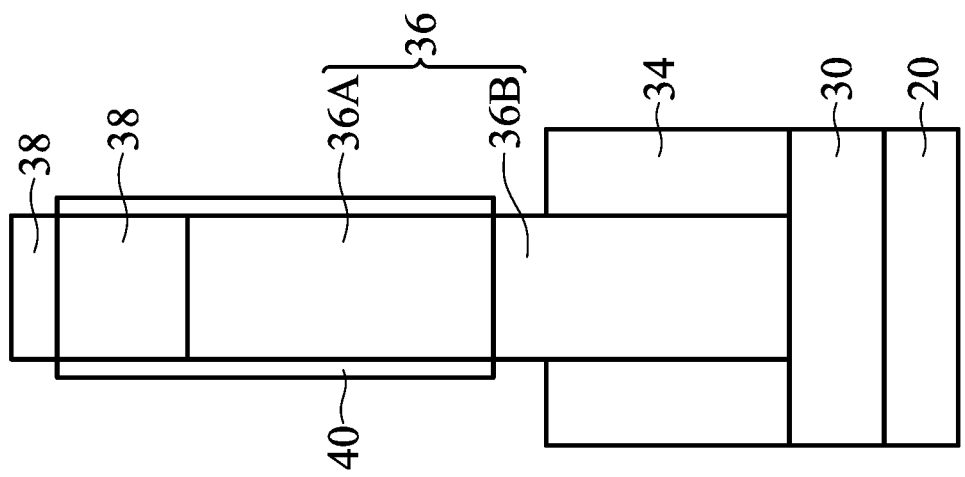
Figure 9A:
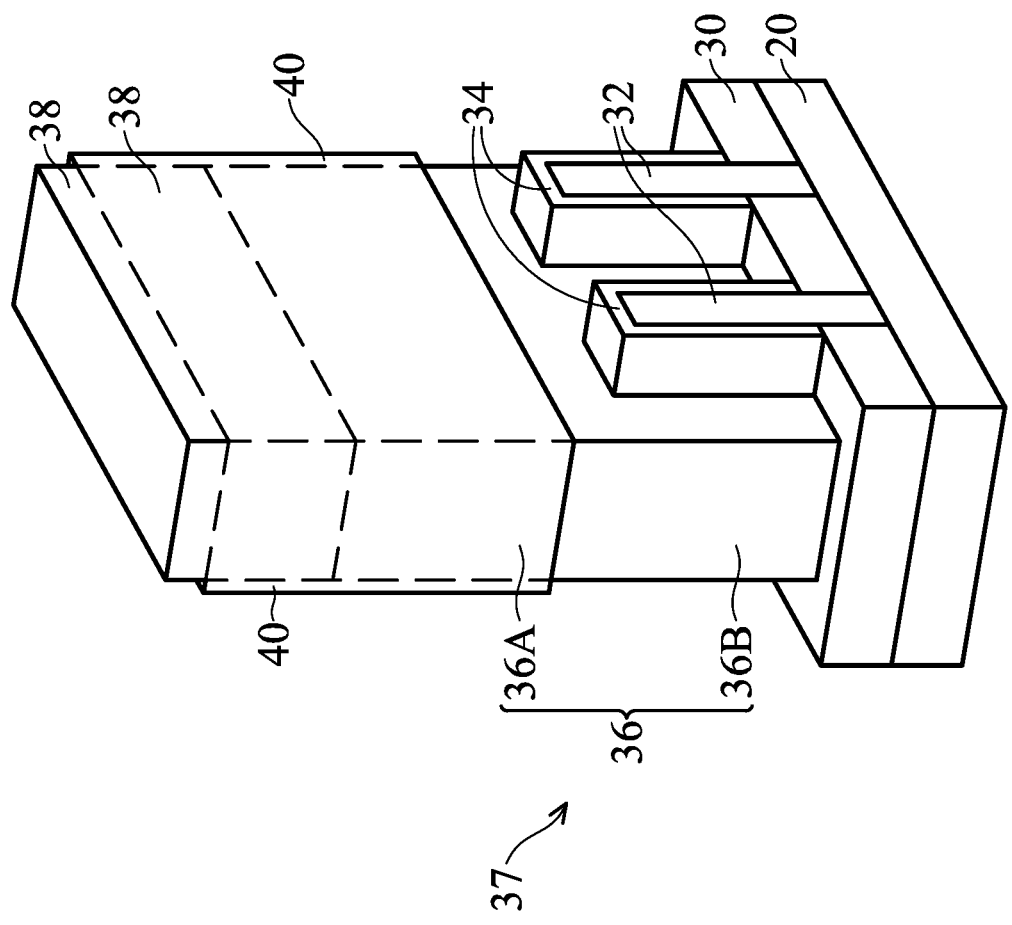

Referring to FIG. 9A, an anisotropic etching process is performed on protection layer 40, so that the horizontal portions of protection layer 40 are etched, and the top surface of lower dummy gate electrode portion 36B is exposed. The respective process is illustrated as process 214 in the process flow shown in FIG. 23. Next, a second etching process is further performed to etch lower dummy gate electrode portion 36B. The respective process is illustrated as process 216 in the process flow shown in FIG. 23. The remaining portions of dummy gate electrode layer 36 are referred to as a dummy gate electrode, which is also referred to using reference numeral 36 hereinafter.

The second etching process is anisotropic so that the resulting lower gate electrode portion 36B has substantially vertical sidewalls. In the second etch, since dummy gate dielectrics 34 and STI regions 30 are exposed, to prevent dummy gate dielectrics 34 and STI regions 30 from being etched, the etching gas is selected not to attack dummy gate dielectrics 34 and STI regions 30. The respective etching selectivity values may be higher than about 10, 20, or higher, wherein the etching selectivity values are the ratios of the etching rate of dummy gate electrode layer 36 to the etching rates of the dummy gate dielectrics 34 and STI regions 30. Also, in the second etching, protection layer 40 remains as a full layer covering the sidewalls of upper dummy gate electrode portion 36A.

In accordance with some embodiments in which dummy gate electrode layer 36 is formed of amorphous silicon or polysilicon, the etching gas of the second etching process may include a mixture of HBr, chlorine ($Cl_2$), and oxygen ($O_2$). The fluorine-based gas as adopted in the first etching process of upper dummy gate electrode portion 36A may be excluded from the second etching process. Alternatively, the fluorine-based gas is also included with a reduced amount than in the first etching. For example, assuming the flow rate of the fluorine-based gas in the etching of upper dummy gate electrode portion 36A is FRU, and the flow rate of the fluorine-based gas in the etching of lower dummy gate electrode portion 36B is FRL, ratio FRL/FRU may be smaller than about 0.2 or smaller than about 0.1. A carrier gas such as nitrogen ($N_2$) or argon may also be added into the etching gas. Plasma is turned on, with a second bias power being applied. The second bias power may be substantially equal to, smaller than, or greater than the first bias power for etching upper dummy gate electrode portion 36A. In accordance with some embodiments of the present disclosure, the second bias power is in the range between about 200 Watts and about 400 Watts. In the second etching process, upper dummy gate electrode portion 36A is protected by protection layer 40, and hence is not etched.

FIG. 9B illustrates a perspective view of the structure shown in FIG. 9A, wherein the perspective view is obtained from the direction marked by arrow 37 shown in FIG. 9A.

Figure 10B:
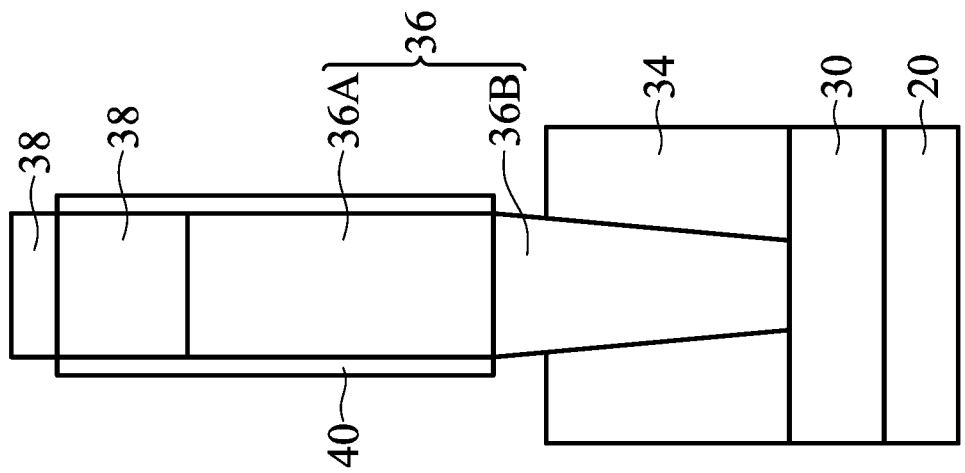
Figure 10A:
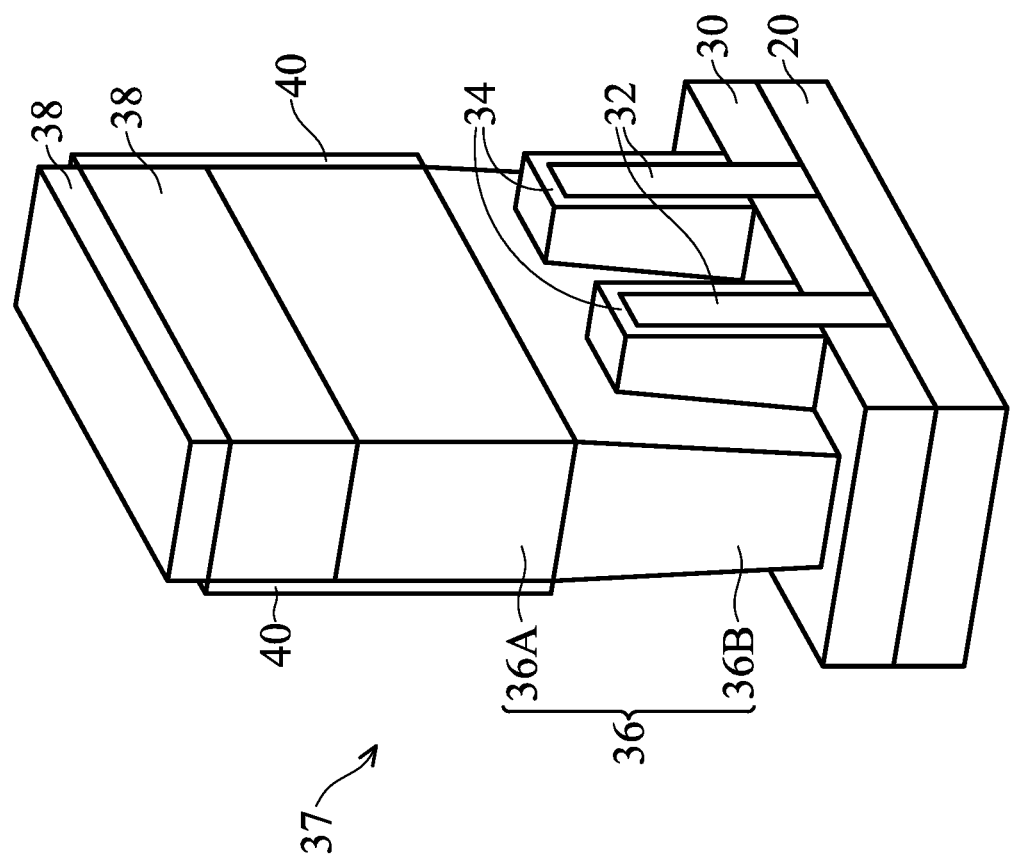

FIGS. 10A and 10B illustrate a trimming process to trim lower dummy gate electrode portion 36B. The respective process is illustrated as process 218 in the process flow shown in FIG. 23. In the trimming process, upper dummy gate electrode portion 36A is protected by protection layer 40. Lower dummy gate electrode portion 36B is trimmed, and hence is narrowed, and possibly tapered. In accordance with some embodiments in which dummy gate electrode layer 36 is formed of amorphous silicon or polysilicon, the etching gas for the trimming process may include a mixture of HBr, of chlorine ($Cl_2$), and oxygen ($O_2$). Again, the fluorine-based gas as adopted in the first etching process may be excluded from the trimming process, or the amount may be reduced compared to the etching of upper dummy gate electrode portion 36A. For example, assuming the flow rate of the fluorine-based gas in the trimming process is FRT, ratio FRT/FRU may be smaller than about 0.2 or smaller than about 0.1. A carrier gas such as nitrogen ($N_2$) or argon may also be added into the etching gas. Plasma is turned on, with a third bias power being applied. The third bias power is lower than the first bias power for etching upper dummy gate electrode portion 36A. In accordance with some embodiments of the present disclosure, the third bias power is in the range between about 50 Watts and about 150 Watts. The ratio of the third power to the first power (and the second power) may be in the range between about 0.1 and about 0.5, for example. Reducing the bias power in the trimming process has the effect of introducing some isotropic effect, so that lower dummy gate electrode portion 36B is tapered rather than having footing. In accordance with some embodiments of the present disclosure, at the end of the second etching process, bias power is reduced to seamlessly transition to the trimming process, and other process conditions are maintain to be unchanged.

In the trimming process, upper dummy gate electrode portion 36A is protected by protection layer 40, and hence is not trimmed. The sidewalls of upper dummy gate electrode portion 36A are thus more vertical than lower dummy gate electrode portion 36B. Alternatively stated, the sidewalls of lower dummy gate electrode portion 36B are more slanted/tilted than the sidewalls of upper dummy gate electrode portion 36A. The process conditions (such as the isotropic effect) are adjusted to adjust the tilt angle of the lower portion of dummy gate electrode layer 36. For example, reducing the bias power may cause the sidewalls of lower dummy gate electrode portion 36B to be more tilted.

In accordance with some embodiments of the present disclosure, after the trimming process, the remaining portions of protection layer 40 are removed, for example, in a wet etch process or a dry etch process. In accordance with alternative embodiments of the present disclosure, after the trimming process, the remaining portions of protection layer 40 is not removed, and the processes shown in FIGS. 11A, 11B, and 11C are performed with the existence of protection layer 40.

FIG. 10B illustrates a perspective view of the structure shown in FIG. 10A, wherein the perspective view is obtained from the direction marked by arrow 37 shown in FIG. 10A. The tapered sidewalls of lower dummy gate electrode portion 36B are shown in FIG. 10B.

Figure 11A:
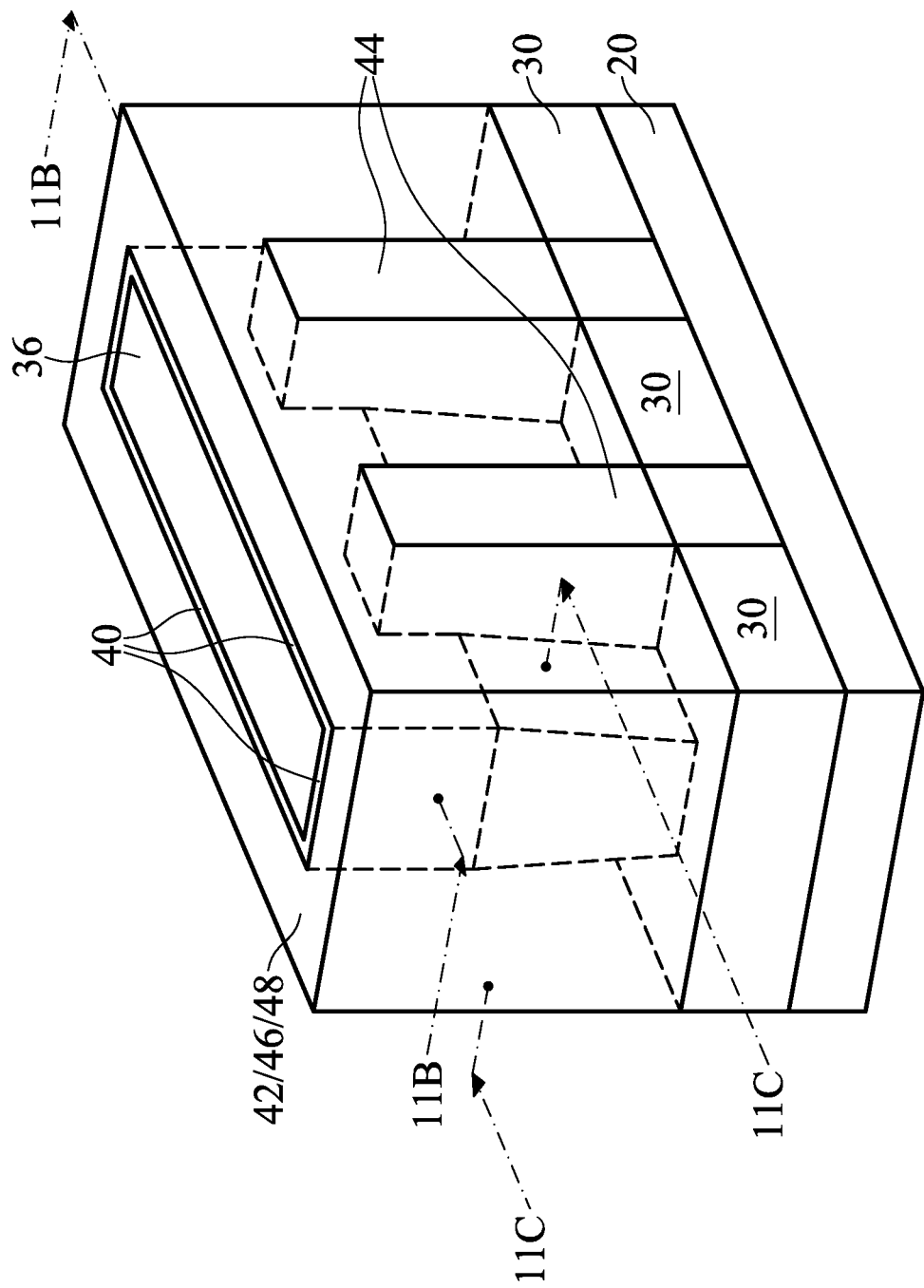
Figure 11C:
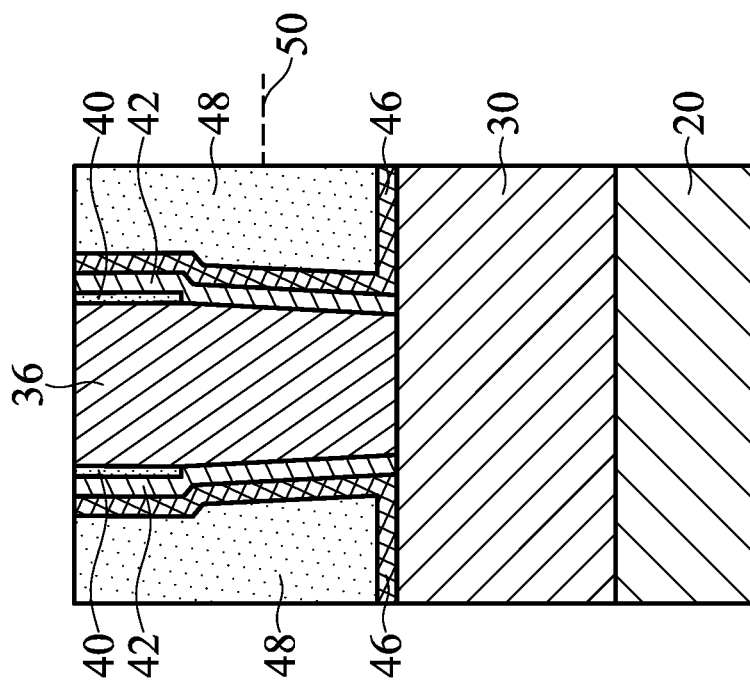
Figure 11B:
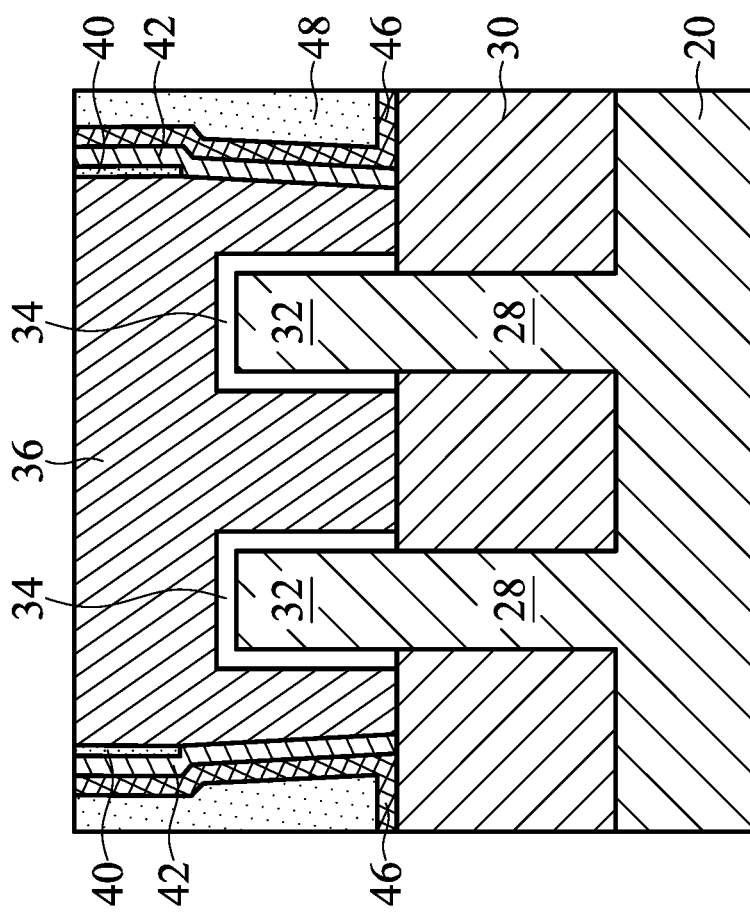

FIGS. 11A, 11B, and 11C illustrate a perspective view and cross-sectional views of the structure after the formation of gate spacers, source/drain (S/D) regions, a Contact Etch Stop Layer (CESL), and an Inter-Layer Dielectric (ILD). The respective process is illustrated as process 220 in the process flow shown in FIG. 23. FIG. 11A illustrates a schematic view of gate spacers 42, source/drain (S/D) regions 44, CESL 46, and ILD 48, wherein the details may be found in the cross-sectional view shown in FIGS. 11B and 11C. The formation processes of these components are discussed briefly in subsequent paragraphs.

First, gate spacers 42 (refer to FIGS. 11B and 11C) are formed. Gate spacers 42 are formed on the sidewalls of dummy gate electrode 36 and hard mask 38 (FIG. 10A). In accordance with some embodiments of the present disclosure, gate spacers 42 are formed by conformably depositing a dielectric layer(s), and then performing an anisotropic etching to remove the horizontal portions of the dielectric layer(s), leaving the vertical portions of the dielectric layer(s). In accordance with some embodiments of the present disclosure, gate spacers 42 are formed of silicon nitride, and may have a single-layer structure. In accordance with alternative embodiments of the present disclosure, gate spacers 42 have a composite structure including a plurality of layers. For example, gate spacers 42 may include a silicon oxide layer, and a silicon nitride layer over the silicon oxide layer.

Dummy gate electrode 36 and gate spacers 42 in combination cover some portions of semiconductor fins 32, leaving some other portions not covered.

Source/drain region 44 (FIG. 11A) are then formed based on the exposed portions of semiconductor fins 32. In accordance with some embodiments of the present disclosure, the formation of source/drain region 44 includes implanting the exposed semiconductor fins 32 with a p-type or n-type dopant to form p-type or n-type source/drain regions. In accordance with some embodiments of the present disclosure, the formation of source/drain region 44 includes etching the exposed portions of semiconductor fins 32, and re-growing epitaxy semiconductor regions from the respective recesses. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), SiGe, or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, source/drain regions 44 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions fully fill the recesses, the epitaxy regions start expanding horizontally, and facets may be formed. An implantation may be performed to introduce more p-type or n-type impurities into source/drain regions 44.

Next, CESL 46 (FIGS. 11B and 11C) is deposited conformally. ILD 48 is then formed on CESL 46. A planarization process such as a CMP process or a mechanical grinding process is then performed to remove excess portions of ILD 48 and CESL 46. In accordance with some embodiments of the present disclosure, the planarization process removes hard mask 38 as shown in FIG. 10A, and dummy gate electrode layer 36 is exposed, as shown in the resulting structure in FIGS. 11B and 11C. In accordance with alternative embodiments of the present disclosure, the CMP stops on hard mask 38.

FIG. 11B illustrates the cross-sectional obtained from the vertical plane containing line 11B-11B in FIG. 11A. FIG. 11C illustrates the cross-sectional obtained from the vertical plane containing line 11C-11C in FIG. 11A. As shown in FIGS. 11B and 11C, gate spacers 42 are on outer side of, and contacting, protection layer 40. When viewed from top, protection layer 40 may form a full ring encircling dummy hard mask 38 (if remaining) and the top portion of dummy gate electrode 36. Gate spacers 42 form another full ring encircling the ring of protection layer 40. Line 50 in FIG. 11C represents the top surface level of semiconductor fins 32 (FIG. 11B). The bottom ends of protection layer 40 are higher than the top surface level 50 of semiconductor fins 32 in accordance with some embodiments.

Figure 12A:
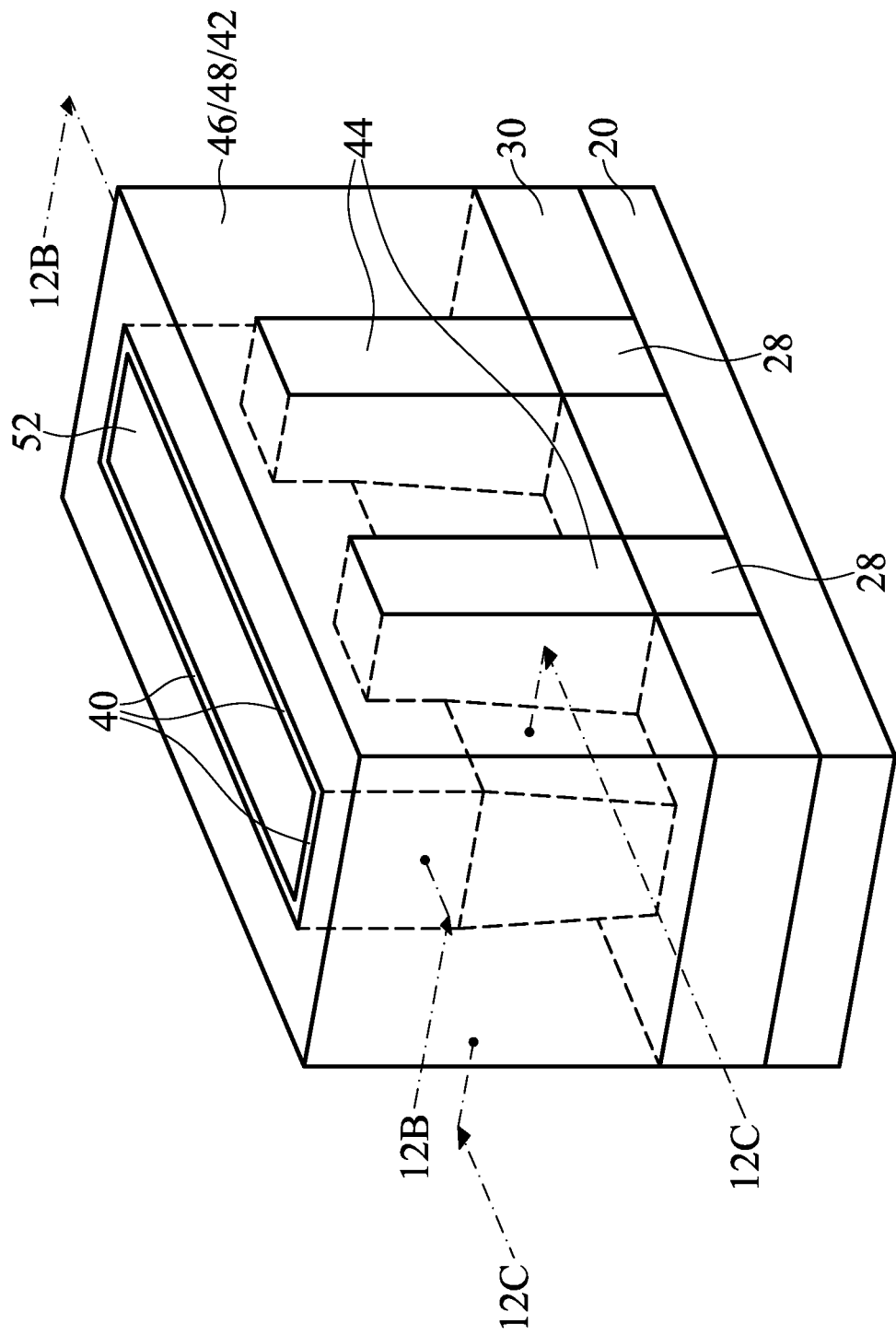

FIGS. 12A, 12B, and 12C illustrate a perspective view and cross-sectional views of the structure after dummy gate dielectrics 34 and dummy gate electrode 36 are replaced with replacement gate stack 52. The respective process is illustrated as process 222 in the process flow shown in FIG. 23. FIG. 12A illustrates a schematic view, wherein some details may be found in the cross-sectional view shown in FIGS. 12B and 12C. FIG. 12B illustrates the cross-sectional obtained from the vertical plane containing line 12B-12B in FIG. 12A. FIG. 12C illustrates the cross-sectional obtained from the vertical plane containing line 12C-12C in FIG. 12A.

In the replacing of gate stacks, dummy gate electrode 36 (FIGS. 11A, 11B, and 11C) is first etched, resulting in a trench encircled by protection layer 40 and gate spacer 42. In subsequent steps, the exposed dummy oxide 34 (FIG. 11B) is etched, exposing a portion of semiconductor fin 32. Protection layer 40 is also exposed through the trench. Protection layer 40, if to be removed, may be removed from the trench. Next, replacement gate stack 52, as shown in FIG. 12A, is formed in the trench. Replacement gate stack 52 may include one or a plurality of dielectric layers to form replacement gate dielectric 54 (FIG. 12B), and a plurality of conductive layers to form replacement gate electrode 56. In accordance with some embodiments of the present disclosure, the formation of gate dielectric 54 includes forming an interfacial (dielectric) layer, and then forming a high-k dielectric layer over the interfacial layer. The interfacial layer may be a silicon oxide layer. The high-k dielectric layer is deposited on the interfacial layer. In accordance with some embodiments of the present disclosure, the high-k dielectric layer has a k value greater than about 7.0, and may include a metal oxide or a silicate of Hf, Al, Zr, La, and the like.

Replacement gate electrode 56 is formed over replacement gate dielectric 54. Replacement gate electrode 56 may include a plurality of metal-containing layers formed of metal-containing materials such as TiN, TaN, TaC, TiAl, Co, Ru, Al, Cu, W, alloys thereof, or multi-layers thereof. After the formation of gate dielectric 54 and gate electrode 56, a planarization process such as a CMP process or a mechanical grinding process is performed to remove excess portions of gate dielectric 54 and gate electrode 56 over ILD 48. FinFET 57 is thus formed.

As shown in FIGS. 12B and 12C, gate stack 52 has a top portion 52A having substantially vertical sidewalls, and a tapered lower portion 52B. In accordance with some embodiments of the present disclosure, protection layer 40 is left in FinFET 57. Also, protection layer 40 may be formed of a same material as, or a material different from, the material of either one or both of gate dielectric 54 (such as high-k dielectric material) and gate spacer 42.

Referring to FIG. 12B, gate stack 52 includes sidewalls 52A', which are also the sidewalls of gate dielectrics 54. Each of sidewalls 52A' includes upper portion 52A1' and lower portion 52A2', both may be substantially straight. Upper portion 52A1' has a first tilt angle $\theta 1$. Upper portion 52A1' may be vertical or substantially vertical, for example, with tilt angle $\theta 1$ being smaller than about 2 degrees or smaller than about 1 degree. Lower portion 52A2' has a second tilt angle $\theta 2$. Lower portion 52A2' is tilted with the tilt angle $\theta 2$ being greater than 1 degree or greater than about 3 degrees. In accordance with some embodiments of the present disclosure, tilt angle $\theta 2$ is in the range between about 3 degrees and about 10 degrees. Tilt angle $\theta 2$ is greater than tilt angle $\theta 1$, with difference ($\theta 2 - \theta 1$) being greater than 1 degree, and possibly greater than about 3 degrees. Tilt angle difference ($\theta 2 - \theta 1$) may also be in the range between about 3 degrees and about 10 degrees.

Referring to FIG. 12C, gate stack 52 includes sidewalls 52A", which are also the sidewalls of gate dielectrics 54. Each of sidewalls 52A" includes an upper portion 52A1" and lower portion 52A2", both may be substantially straight. Upper portion 52A1" has a first tilt angle $\theta 1'$. Lower portion 52A2" has a second tilt angle $\theta 2'$. Tilt angles $\theta 1$, $\theta 2$, $\theta 1'$, and $\theta 2'$ are all the tile angles of the sidewalls of gate stack 52, except tilt angles $\theta 1$ and $\theta 2$ are viewed in the vertical plane perpendicular to the lengthwise direction of semiconductor fins 32, and tilt angles $\theta 1'$ and $\theta 2'$ are viewed in the vertical plane parallel to the lengthwise direction of semiconductor fins 32. The tilt angles θ1' and θ2' may be in the substantially same ranges as the corresponding tilt angles θ1 and θ2. Tilt angles θ1 and θ1' may be equal to each other or slightly different from each other. Tilt angles θ2 and θ2' may be equal to each other or slightly different from each other.

Figure 13:
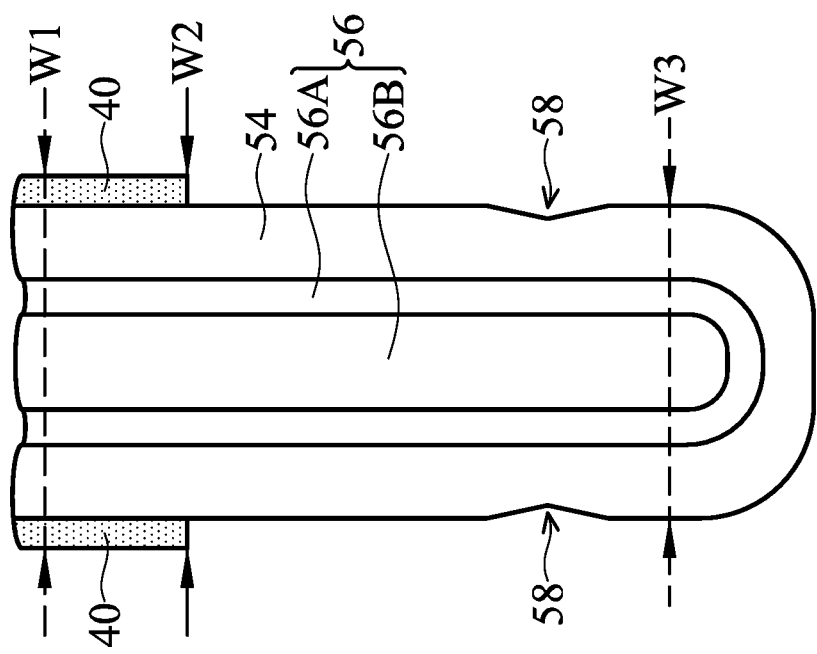
FIG. 13 illustrates a cross-sectional view of a gate stack in accordance with some embodiments.

FIG. 12C also illustrates three dimensions W1, W2, and W3 of gate stack 52 measured at different levels. Width W2 is measured at the bottom end of protection layer 40. Since the top end of gate stack 52 may be rounded, top width W1 may be measured at a level where the sidewalls of gate stack 52 are already straight. For example, top width W1 may be measured at the top end of protection layer 40 or at a level that is 5 nm below the top end of protection layer 40. Bottom width W3 may be measured at the level of the bottommost point of the filling metal (such as tungsten or cobalt) (as shown in FIG. 13), or at a level that is about 10 nm higher than the bottommost point of gate stack 52. Widths W1 and W2 may be substantially equal to each other, for example, with the absolute value of the difference (W1−W2) being smaller than about 3 Å or smaller than 1 Å. Widths W1 and W2 may be greater than width W3, for example, with widths (W1−W3) and (W2−W3) may be greater than about 3 Å or greater than about 5 Å. Widths (W1−W3) and (W2−W3) may also be in the range between about 3 Å and about 10 Å.

FIG. 12C illustrates the heights H1, H2, and H3. Height H1 is the height of protection layer 40. Height H2 is the height of the portion of gate stack directly over the top end of semiconductor fin 32, wherein level 50 marks the level of the top end of fin 32. Height H3 is the height of gate stack 52. In accordance with some embodiments of the present disclosure, H2 is greater than (as shown in FIG. 12C), equal to, or smaller than (as shown in FIG. 21C) height H1. Heights H1 and H2 are smaller than height H3. Height H1 may be in the range between about 5 Å and about 2,000 Å. Height H2 may be in the range between about 5 Å and about 2,000 Å, and may also be in the range between about 100 Å and about 500 Å. Height H3 may be in the range between about 5 Å and about 2,000 Å, and may also be in the range between about 300 Å and about 700 Å.

FIG. 13 illustrates a more detailed view of gate stack 52 and protection layer 40. Gate stack 52 includes gate dielectric 54, a plurality of metal layers 56A, and filling metal 56B over the bottom portion of metal layers 56A. Metal layers 56A may include diffusion barriers, work function layers, adhesion layers, or the like. Filling metal 56B may be formed of tungsten or cobalt.

Figure 14D:
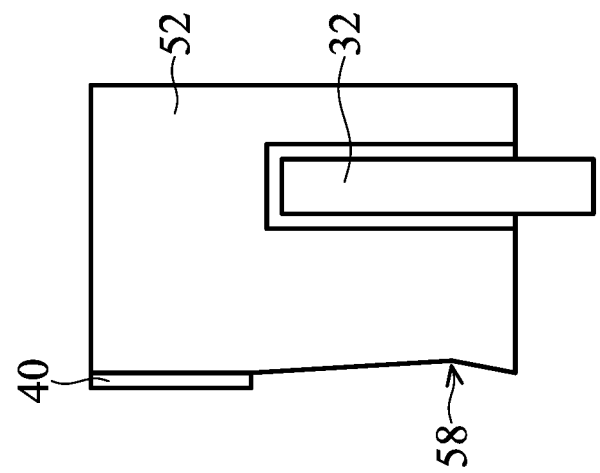
FIGS. 14A, 14B, 14C, and 14D illustrate some profiles of gate stacks in accordance with some embodiments.
Figure 14C:
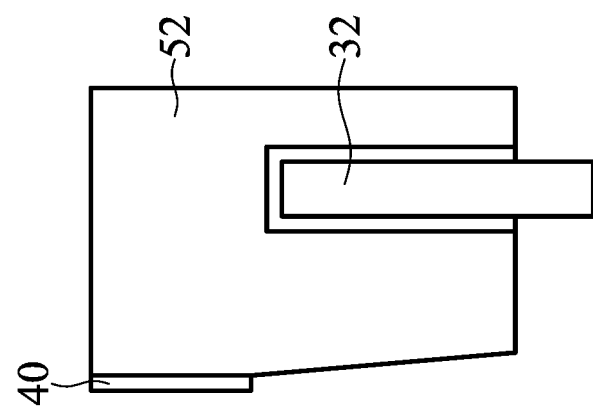
Figure 14B:
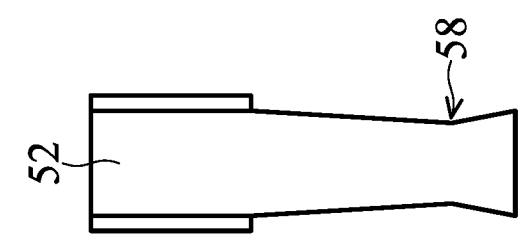
Figure 14A:
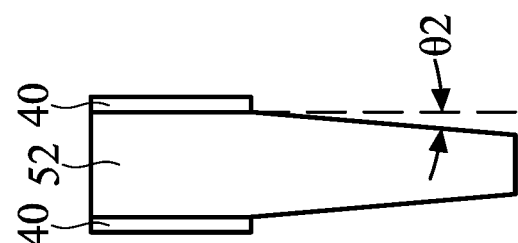

FIGS. 14A, 14B, 14C, and 14D illustrate the possible schematic profiles of the sidewalls of gate stack 52. FIGS. 14A and 14B reflect the cross-sectional views corresponding to FIG. 12C. FIGS. 14C and 14D reflect the cross-sectional views of corresponding to the left part of FIG. 12B. In FIGS. 14A and 14C, the upper portion of gate stack 52 is straight and vertical, and the lower portion of gate stack 52 is straight and continuously tapers down. In FIGS. 14B and 14D, the lower portion of gate stack 52 has a general tapered profile, with the entire lower portion being narrower than the upper portion. At level 58, however, gate stack 52 has a neck, and some portions of gate stack 52 lower than level 58 have widths greater than the width at level 58. The neck at level 58 is also shown in FIG. 13.

FIGS. 15A and 15B through FIGS. 21A, 21B, and 21C illustrate cross-sectional views of intermediate stages in the formation of a FinFET in accordance with alternative embodiments. These embodiments are similar to the embodiments in FIGS. 1 through 12A/12B/12C, except that the first etching process of the dummy gate electrode layer stops after dummy gate dielectrics 34 are exposed. Unless specified otherwise, the materials and the formation methods of the components in these embodiments are essentially the same as the like components, which are denoted by like reference numerals in the embodiments shown in FIGS. 1 through 12A, 12B, and 12C. The details regarding the formation process and the materials of the components shown in FIGS. 15A/15B through 21A/21B/21C may thus be found in the discussion of the embodiment shown in FIGS. 1 through 12A/12B/12C.

Figure 15B:
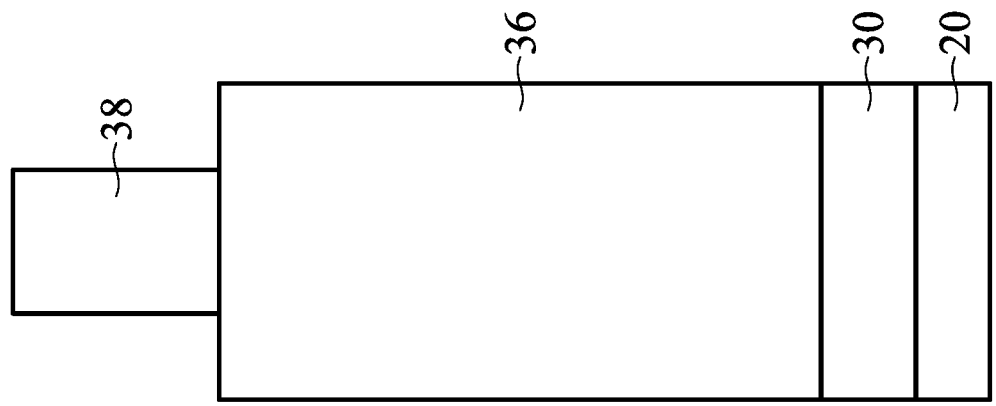
Figure 15A:
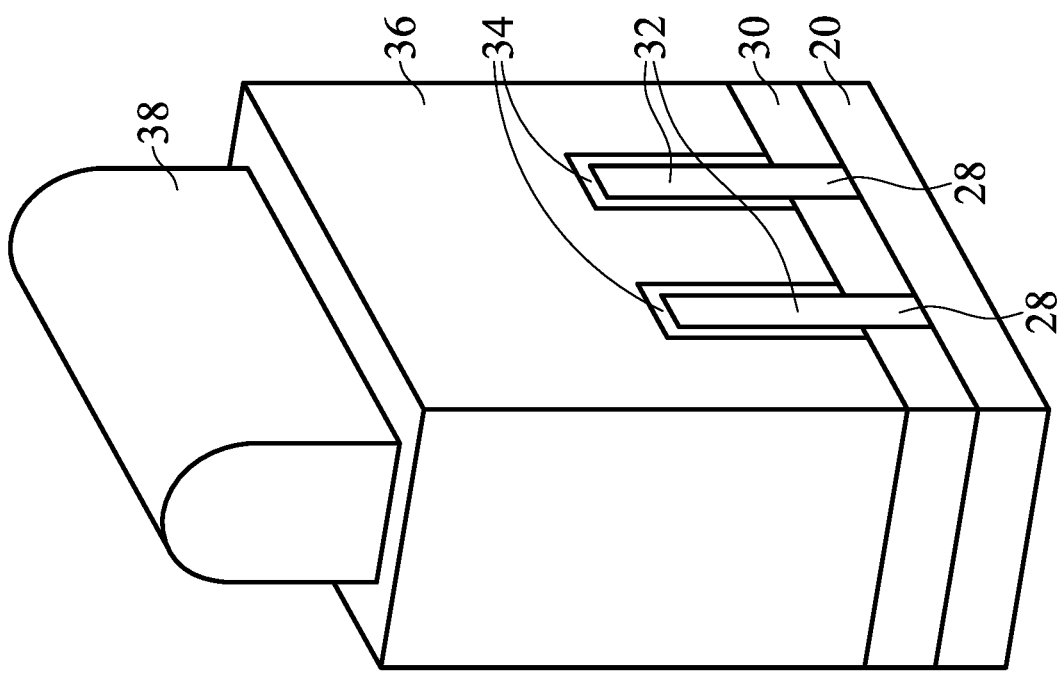

The initial steps of these embodiments are essentially the same as shown in FIGS. 1 through 6A and 6B, and the resulting structure is illustrated in FIGS. 15A and 15B, which are similar to what are shown in FIGS. 6A and 6B, respectively. Next, as shown in FIGS. 16A and 16B, upper dummy gate electrode portion 36A is etched. The etching is stopped at a level lower than the top surfaces of dummy gate dielectrics 34, and may be lower than the top surfaces of semiconductor fins 32. Accordingly, the top surfaces and the sidewalls of dummy gate dielectrics 34 are exposed. In accordance with some embodiments of the present disclosure, the height H4 of the un-etched lower portion 36B is smaller than about 20 percent of total height H5 of dummy gate electrode layer 36 to allow enough room for the lower portion of the resulting gate stacks to taper.

Figure 18B:
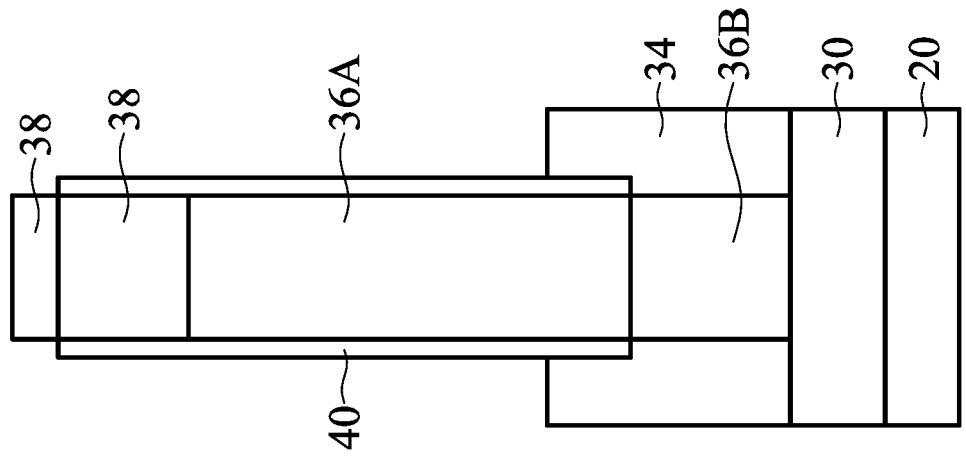
Figure 18A:
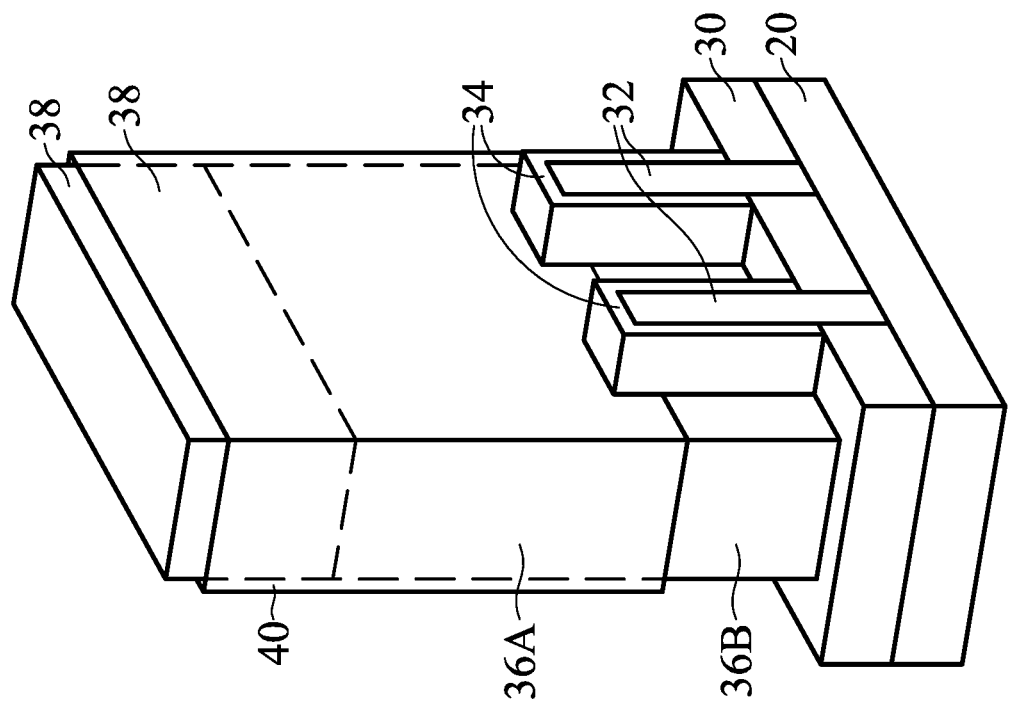
Figure 20A:
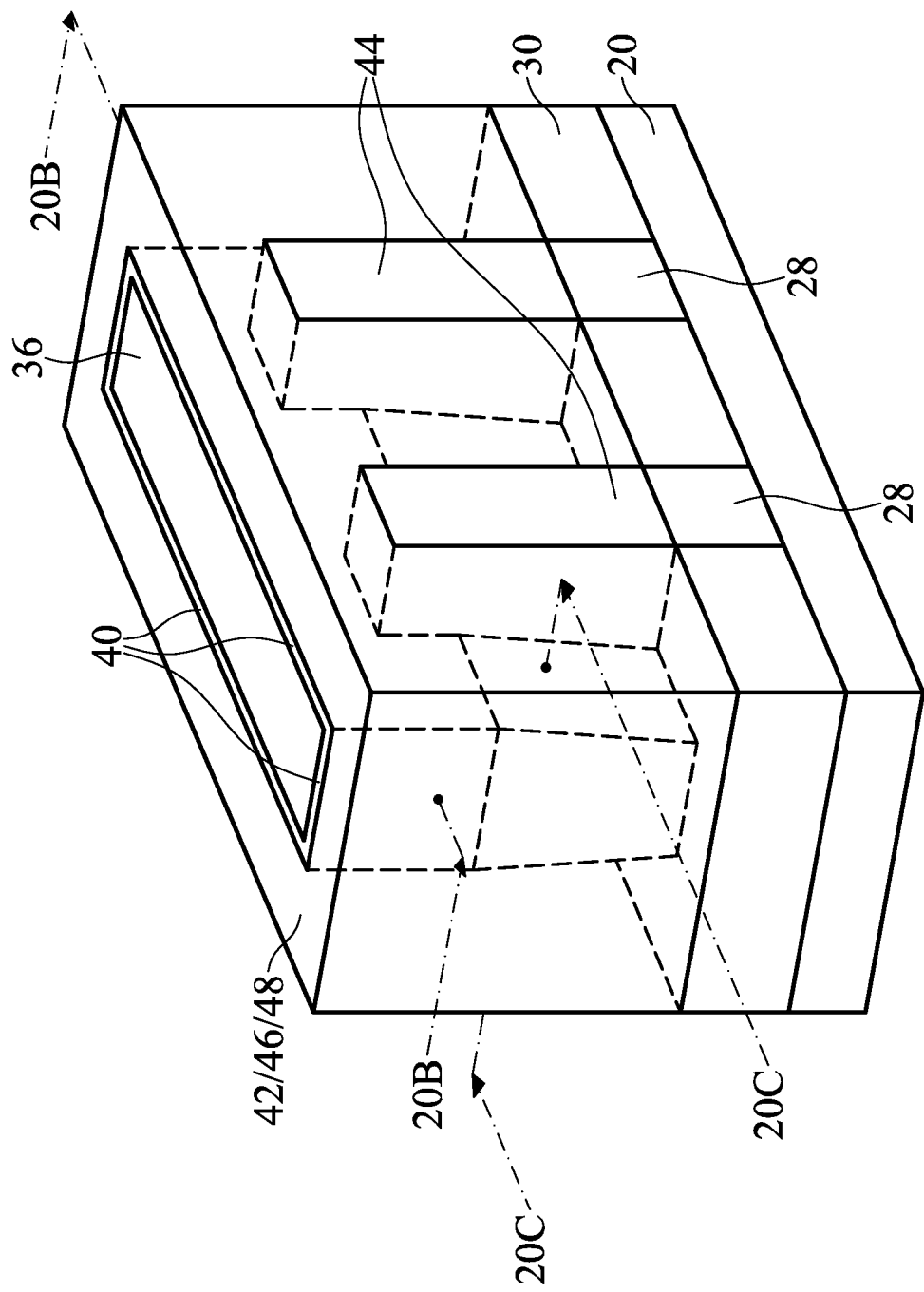
Figure 20C:
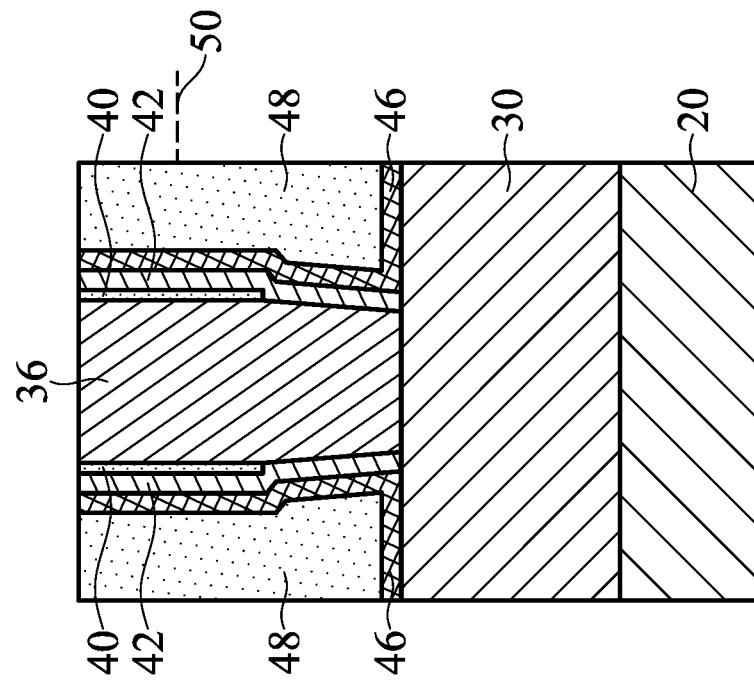
Figure 20B:
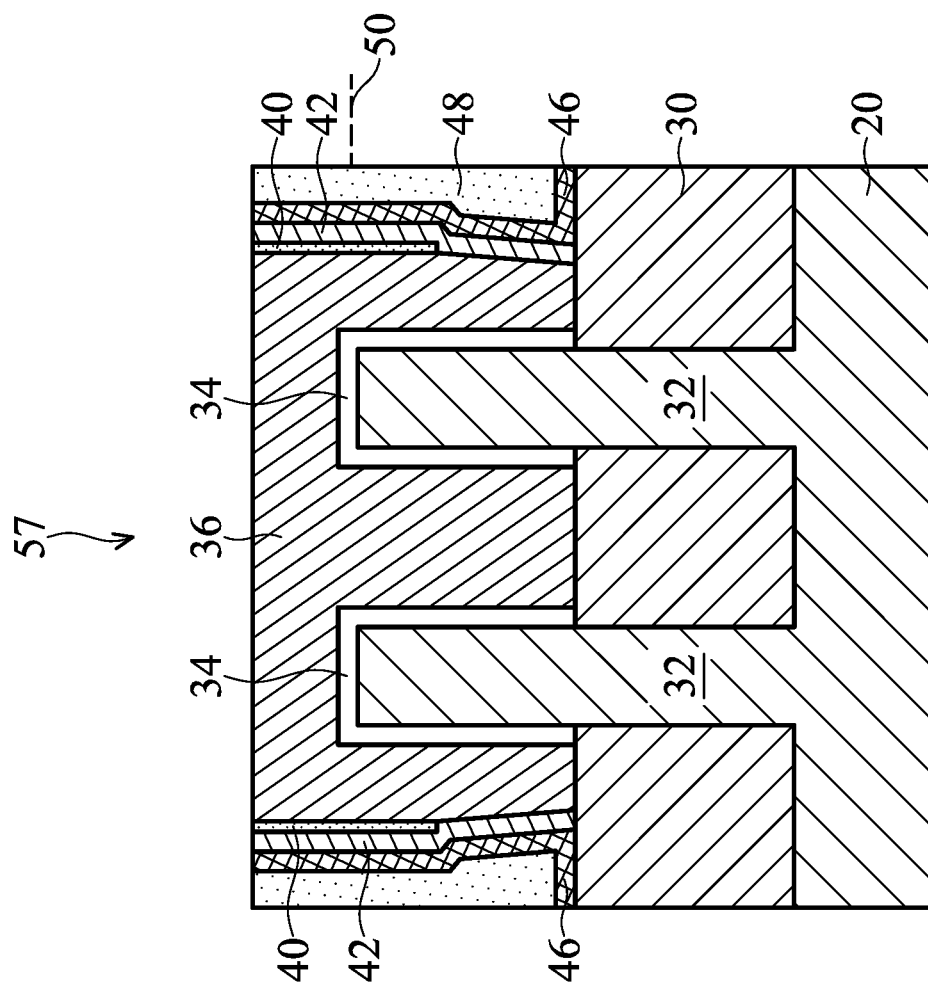

The subsequent steps are essentially the same as shown in FIGS. 8A/8B through 12A/12B/12C. For example, in FIGS. 17A and 17B, protection layer 40 is formed as a conformal layer. In FIGS. 18A and 18B, the horizontal portions of protection layer 40 are removed by etching, so that the underlying lower dummy gate electrode portion 36B is exposed. Lower dummy gate electrode portion 36B is then etched until STI regions 30 are exposed. The etching process is essentially the same as discussed referring to FIGS. 9A and 9B. Next, a trimming process is performed, as shown in FIGS. 19A and 19B, so that the lower gate electrode portion 36B are tapered. FIGS. 20A, 20B, and 20C illustrate the perspective view and the cross-sectional views after the formation of gate spacers 42, source/drain regions 44, CESL 46, and ILD 48. The structure shown in FIGS. 20A, 20B, and 20C are similar to what are shown in FIGS. 11A, 11B and 11C, except that the bottom ends of protection layer 40 are lower than the top surfaces of semiconductor fins 32. The resulting FinFET 57 is also similar to what is shown in FIG. 11B.

Figure 21A:
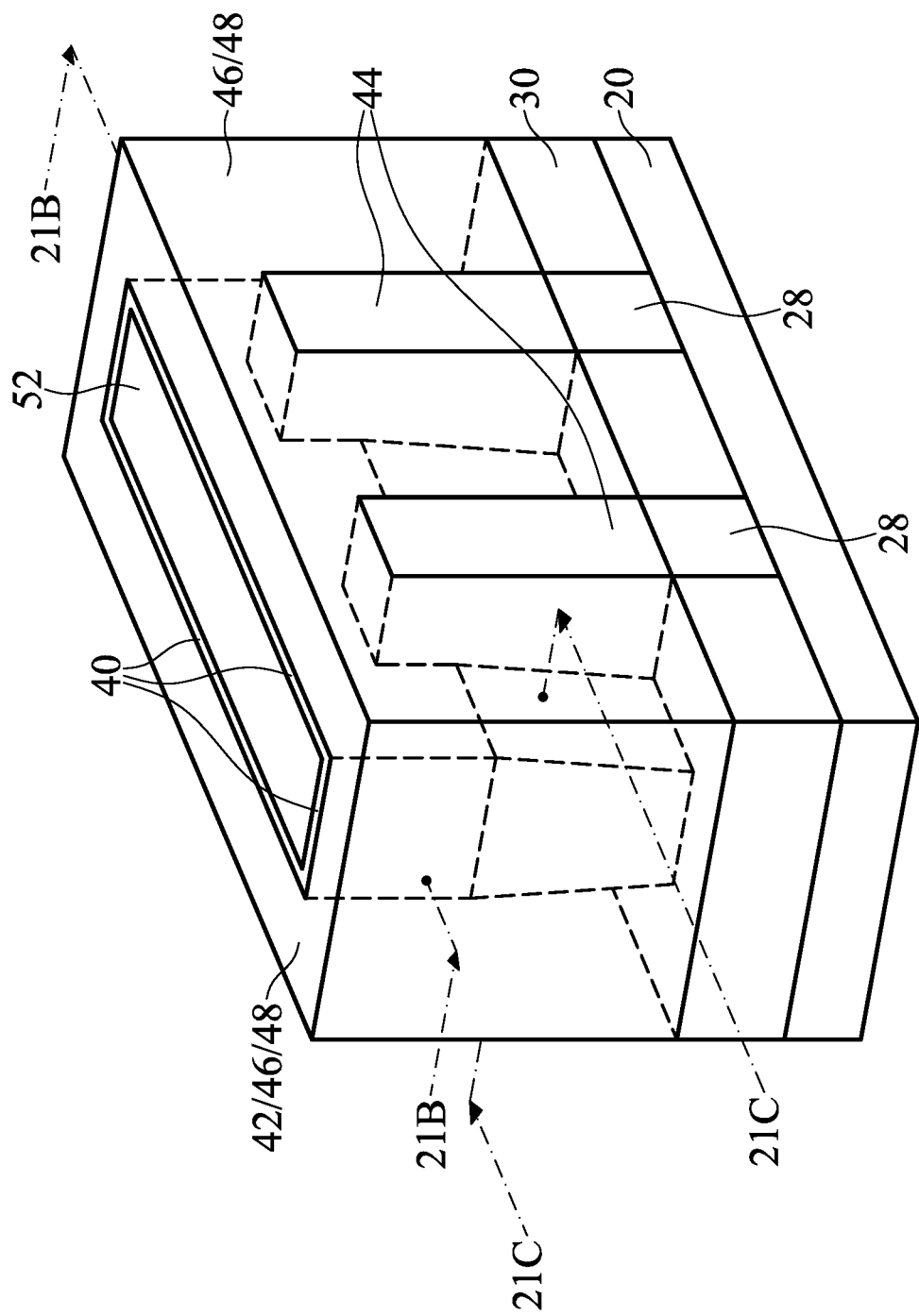
Figure 21C:
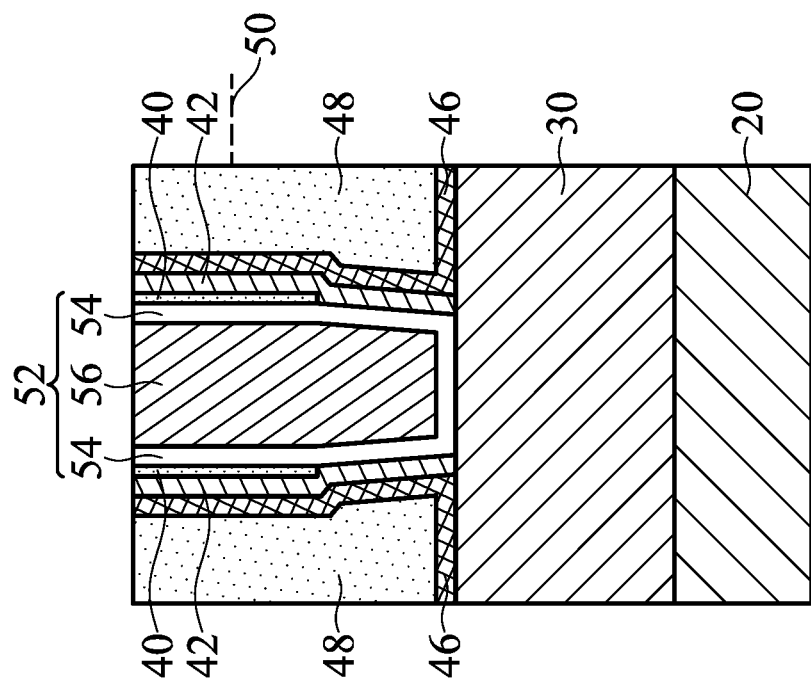
Figure 21B:
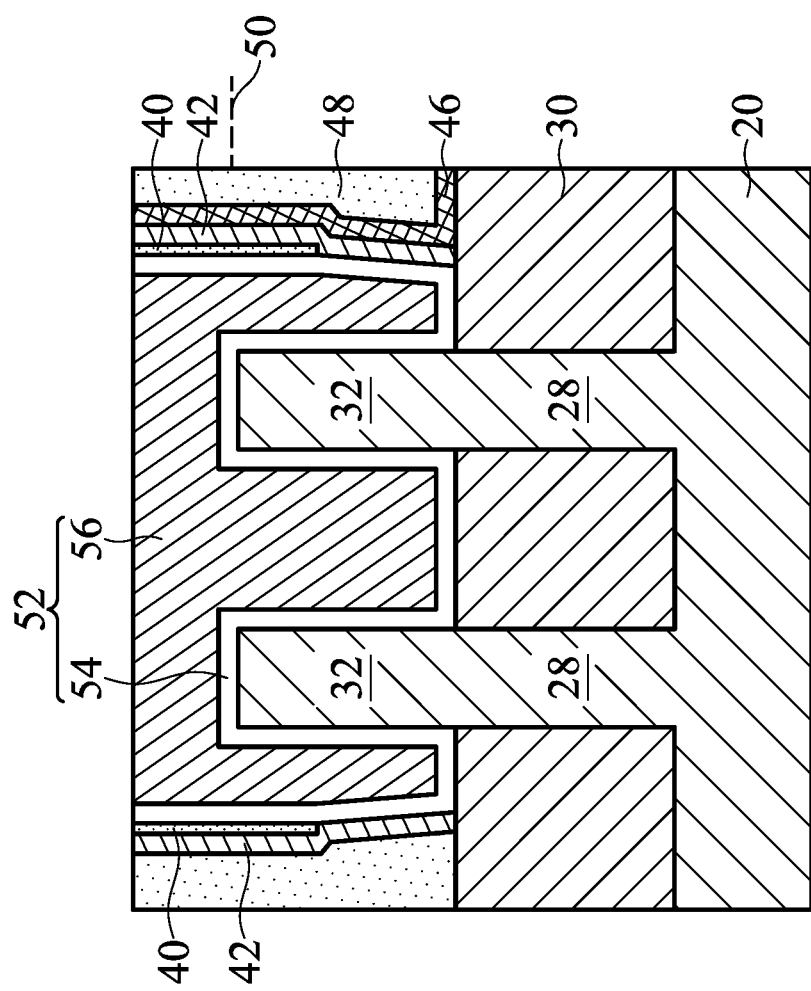

FIGS. 21A, 21B, and 21C illustrate the perspective view and the cross-sectional views after replacement gate stack 52 is formed. The structure shown in FIGS. 21A, 21B, and 21C are similar to what are shown in FIGS. 12A, 12B and 12C, except that the bottom ends of protection layer 40 are lower than the top surfaces (and top surface levels 50) of semiconductor fins 32.

Figure 22D:
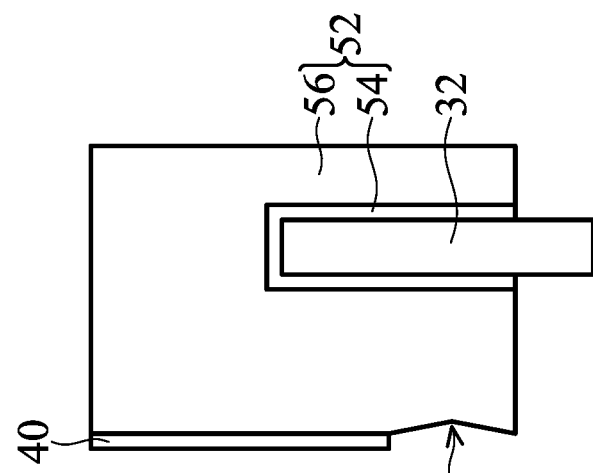
FIGS. 22A, 22B, 22C, and 22D illustrate some profiles of gate stacks in accordance with some embodiments.
Figure 22C:
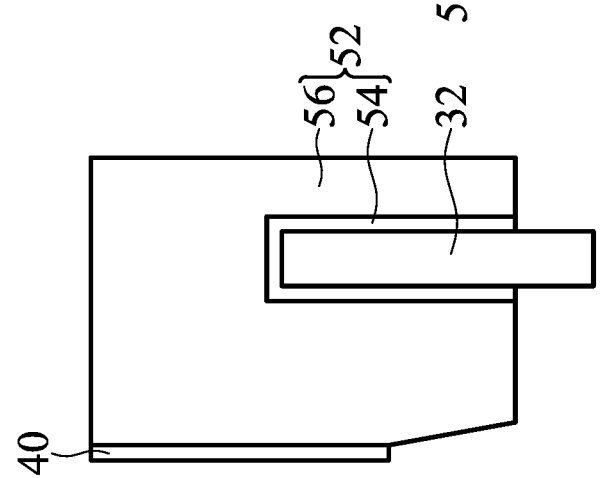
Figure 22B:
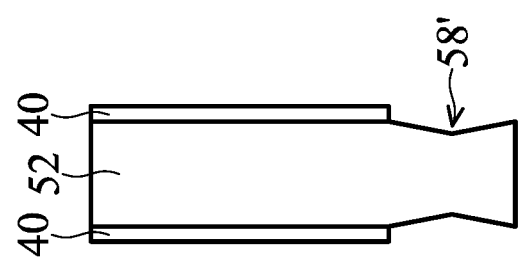
Figure 22A:
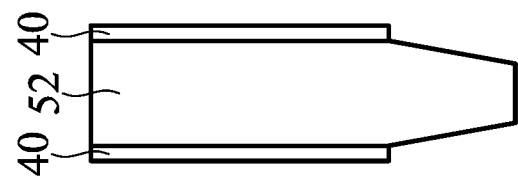

FIGS. 22A, 22B, 22C, and 22B illustrate the schematically profiles of the sidewalls of gate stacks 52. FIGS. 22A and 22B reflect the cross-sectional views corresponding to FIG. 21C. FIGS. 22C and 22D reflect the cross-sectional views corresponding to the left part of FIG. 21B. In FIGS. 22A and 22C, the upper portion of gate stack 52 is straight and vertical, and the lower portion of gate stack 52 is straight and continuously tapers down. In FIGS. 22B and 22D, the lower portion of gate stack 52 has a general tapered profile, with the entire lower portion being narrower than the upper portion. At level 58', however, gate stack 52 has a neck, and some portions of gate stack 52 lower than level 58' have widths greater than the width at level 58'.

It is appreciated that although the discussed embodiments use FinFETs as examples, the concept of the present disclosure is readily applicable to other transistors such as planar transistors. For example, the patterning of the dummy gate electrode layers of the planar transistors may adopt the etching process as discussed above, and the lower portion of the resulting replacement gate stack may have a tapered profile.

The embodiments of the present disclosure have some advantageous features. Since the lower portions of the gate stacks may be at the same level as source/drain regions, by forming gate stacks with the lower portions tapered, the distance between the gate stacks and the neighboring source/drain regions of the FinFETs is increased. Accordingly, the leakage current that may occur between the gate stacks and the source/drain regions is reduced. Furthermore, the parasitic capacitance between the gate stacks and the source/drain regions is reduced.

In accordance with some embodiments of the present disclosure, a method includes forming a dummy gate electrode layer over a semiconductor region, forming a mask strip over the dummy gate electrode layer, and performing a first etching process using the mask strip as a first etching mask to pattern an upper portion of the dummy gate electrode layer. A remaining portion of the upper portion of the dummy gate electrode layer forms an upper part of a dummy gate electrode. The method further includes forming a protection layer on sidewalls of the upper part of the dummy gate electrode, and performing a second etching process on a lower portion of the dummy gate electrode layer to form a lower part of the dummy gate electrode, with the protection layer and the mask strip in combination used as a second etching mask. The dummy gate electrode and an underlying dummy gate dielectric are replaced with a replacement gate stack. In an embodiment, the lower portion of the dummy gate electrode layer is etched in a process comprising: etching the lower portion until an isolation region underlying the dummy gate electrode layer is revealed; and trimming the lower part of the dummy gate electrode to have a tapered profile. In an embodiment, sidewalls of the upper part of the dummy gate electrode are substantially straight, and sidewalls of the lower part of the dummy gate electrode are more slanted than the upper part of the dummy gate electrode. In an embodiment, the semiconductor region comprises a semiconductor fin protruding higher than top surfaces of isolation regions on opposite sides of the semiconductor fin, and an interface of the upper part and the lower part of the dummy gate electrode is higher than a top surface of the semiconductor fin. In an embodiment, the semiconductor region comprises a semiconductor fin protruding higher top surfaces of isolation regions on opposite sides of the semiconductor fin, and an interface of the upper part and the lower part of the dummy gate electrode is lower than a top surface of the semiconductor fin. In an embodiment, after the replacing, the replacement gate stack is encircled by the protection layer. In an embodiment, the method further includes removing the protection layer. In an embodiment, the method further includes forming an inter-layer dielectric to embed the protection layer and the dummy gate electrode therein, wherein the replacing comprises: etching the dummy gate electrode to form a trench in the inter-layer dielectric; and removing the protection layer from the trench.

In accordance with some embodiments of the present disclosure, a method includes forming isolation regions extending into a semiconductor substrate; forming a semiconductor fin protruding higher than the isolation regions; forming a dummy gate dielectric on the semiconductor fin; forming a dummy gate electrode layer over the dummy gate dielectric; performing a first etching process on an upper portion of the dummy gate electrode layer, wherein the first etching process is stopped when a top surface of a lower portion of the dummy gate electrode layer is at an intermediate level between a top surface and a bottom surface of the dummy gate electrode layer; depositing a protection layer; removing horizontal portions of the protection layer, with a vertical portion of the protection layer encircling a remaining upper portion of the dummy gate electrode layer; and performing a second etching process to etch the lower portion of the dummy gate electrode layer, with the protection layer protecting the remaining upper portion of the dummy gate electrode layer during the second etching process. In an embodiment, the method further includes replacing the remaining upper portion and a remaining lower portion of the dummy gate electrode layer and the dummy gate dielectric with a replacement gate stack. In an embodiment, the protection layer has sidewalls contacting sidewalls of the replacement gate stack. In an embodiment, the method further includes removing the protection layer. In an embodiment, when the first etching process is stopped, the dummy gate dielectric is embedded in the lower portion of the dummy gate electrode layer. In an embodiment, when the first etching process is stopped, the dummy gate dielectric is exposed. In an embodiment, the method further includes forming a gate spacer, wherein the protection layer has a bottom surface higher than a bottom surface of the gate spacer.

In accordance with some embodiments of the present disclosure, a device includes a semiconductor fin; a gate stack on a top surface and sidewalls of the semiconductor fin; a gate spacer comprising portions on opposite sides of the gate stack; a protection layer between the gate spacer and the gate stack, wherein the protection layer has a bottom surface higher than a bottom surface of the gate spacer; and a source region and a drain region on opposite sides of the gate stack. In an embodiment, the bottom surface of the protection layer is higher than a top surface of the semiconductor fin. In an embodiment, the bottom surface of the protection layer is lower than a top surface of the semiconductor fin. In an embodiment, the protection layer is formed of a material different from a material of the gate spacer. In an embodiment, the protection layer comprises portions on opposite sides of the gate stack, and the gate spacer comprises portion on opposite sides of a combined region that comprises the gate stack and the protection layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a semiconductor fin;
a gate stack on a top surface and sidewalls of the semiconductor fin;
a gate spacer comprising portions on opposite sides of the gate stack;

a protection layer between the gate spacer and the gate stack, wherein the protection layer has a first bottom surface higher than a second bottom surface of the gate spacer; and a source region and a drain region on opposite sides of the gate stack.

2. The device of claim 1, wherein the first bottom surface of the protection layer is higher than the top surface of the semiconductor fin.

3. The device of claim 1, wherein the first bottom surface of the protection layer is lower than the top surface of the semiconductor fin.

4. The device of claim 1, wherein the protection layer is formed of a first material different from a second material of the gate spacer.

5. The device of claim 1, wherein the protection layer comprises portions on opposite sides of the gate stack, and the gate spacer comprises portions on opposite sides of a combined region that comprises the gate stack and the protection layer.

6. The device of claim 1, wherein the gate stack comprises an upper portion and a lower portion under the upper portion, and wherein the lower portion is narrower than the upper portion.

7. The device of claim 6, wherein a first sidewall of the lower portion is more slanted than a second sidewall of the upper portion.

8. The device of claim 1, wherein the gate spacer comprises:

an upper portion contacting the protection layer; and
a lower portion contacting the gate stack.

9. The device of claim 1, wherein the protection layer forms a full ring encircling the gate stack.

10. A device comprising:
a semiconductor fin;
a gate stack on the semiconductor fin, wherein the gate stack comprises:
 an upper portion; and
 a lower portion overlapped by the upper portion, wherein the lower portion is narrower than the upper portion, and wherein the upper portion is joined to the lower portion at a level higher than a top surface of the semiconductor fin;
a contact etch stop layer comprising portions on opposite sides of, and at a same level as, the gate stack; and
an inter-layer dielectric on the contact etch stop layer.

11. The device of claim 10, wherein a first sidewall of the lower portion of the gate stack is more tilted than a second sidewall of the upper portion of the gate stack, and there is a distinguishable change in tilt angles of the first sidewall and the second sidewall.

12. The device of claim 11 further comprising a protection layer between the contact etch stop layer and the gate stack, wherein a bottom of the protection layer is at a same level where the first sidewall joins the second sidewall.

13. The device of claim 12 further comprising a gate spacer, wherein the gate spacer contacts both of the protection layer and the lower portion of the gate stack.

14. A device comprising:
a semiconductor fin;
a gate stack on the semiconductor fin, wherein the gate stack comprises:
 a gate dielectric contacting the semiconductor fin, wherein the gate dielectric comprises an upper portion and a lower portion under the upper portion; and
 a gate electrode on the gate dielectric;
a gate spacer contacting the lower portion of the gate dielectric; and
a protection layer contacting the upper portion of the gate dielectric, wherein the protection layer spaces the gate spacer apart from the upper portion of the gate dielectric.

15. The device of claim 14, wherein the protection layer forms distinguishable interfaces with the gate dielectric and the gate spacer.

16. The device of claim 14, wherein the protection layer comprises opposite portions on opposing sides of the gate stack.

17. The device of claim 16, wherein the protection layer forms a full ring encircling the gate stack.

18. The device of claim 14 further comprising an isolation region on a side of the semiconductor fin, with the semiconductor fin protruding higher than a top surface of the isolation region, wherein the protection layer is vertically spaced apart from the isolation region.

* * * * *